United States Patent [19]

Fukunaga

[11] Patent Number: 5,510,943
[45] Date of Patent: Apr. 23, 1996

[54] CONTROL CIRCUIT FOR POWER DEVICE AND LEVEL SHIFTING CIRCUIT AND SEMICONDUCTOR INTEGRATED CIRCUIT DEVICE

[75] Inventor: Masanori Fukunaga, Itami, Japan

[73] Assignee: Mitsubishi Denki Kabushiki Kaisha, Tokyo, Japan

[21] Appl. No.: 163,509

[22] Filed: Dec. 9, 1993

[30] Foreign Application Priority Data

Dec. 10, 1992 [JP] Japan .................. 4-330448

[51] Int. Cl.⁶ ............................................. H02H 3/08
[52] U.S. Cl. ............................ 361/18; 361/94; 361/98
[58] Field of Search .................................... 361/92, 93, 18, 361/94, 95, 96, 97, 98; 327/24, 291

[56] References Cited

U.S. PATENT DOCUMENTS

| | | | |
|---|---|---|---|
| 4,709,320 | 11/1987 | Kongoka | 361/92 |
| 4,713,553 | 12/1987 | Townsend et al. | 361/92 |

FOREIGN PATENT DOCUMENTS

| | | |
|---|---|---|
| 4117617 | 12/1991 | Germany . |
| 63-95723 | 4/1988 | Japan . |
| 2-84055 | 3/1990 | Japan . |
| 3-201452 | 9/1991 | Japan . |
| 3-270677 | 12/1991 | Japan . |

*Primary Examiner*—Todd Deboer
*Attorney, Agent, or Firm*—Oblon, Spivak, McClelland, Maier & Neustadt

[57] ABSTRACT

In a control circuit for controlling a power transistor included in a power device, the transistor is turned-off when a drop of a control voltage level or overcurrent in the power transistor is detected. Signals for discriminating the overcurrent from the voltage drop are generated and individually outputted from the control circuit, whereby the reason why the transistors were turned-off can be monitored. After a predetermined time period has passed from the overcurrent had been detected, the transistor is automatically turned-on to recover the operation of the transistor. A capacitor for supplying the control power voltage is re-charged during the time period. It is not necessary to carefully determine the on/off timings of the input signal for waiting the recovery of the control power voltage.

21 Claims, 14 Drawing Sheets

CONTROL CIRCUIT FOR POWER DEVICE AND LEVEL SHIFTING CIRCUIT AND SEMICONDUCTOR INTEGRATED CIRCUIT DEVICE

BACKGROUND OF THE INVENTION

1. Field of the Invention

The present invention relates to a control circuit for power devices such as IGBTs.

2. Description of the Background Art

FIG. 17 is a circuit diagram of a conventional control circuit for power devices of half-bridge connection. Referring to FIG. 17, transistors Q1 and Q2 which are power devices such as IGBTs are connected between main power sources P and N in the form of a totem-pole, and flywheel diodes D1 and D2 are connected in antiparallel to the transistors Q1 and Q2, respectively. An inductive load 1 is connected to a connecting point U of the emitter of the transistor Q1 and the collector of the transistor Q2.

The transistors Q1 and Q2 are driven and controlled on different control voltages VH and VL, respectively. The control voltage VL based on the emitter potential (ground level) of the transistor Q2 is supplied from the positive electrode of a power supply VLS having a grounded negative electrode.

The control voltage VH based on the emitter potential of the transistor Q1 is supplied from the positive electrode of a capacitor CP having a negative electrode connected to the emitter of the transistor Q1. The positive electrode of the capacitor CP is connected to the cathode of a diode DP, and the negative electrode thereof is connected to the emitter of the transistor Q1. The electrical charge charged from the power supply VLS to the capacitor CP through the diode DP is used as the control voltage VH.

The anode of the diode DP is connected to the positive electrode of the power supply VLS. In the drawings, the symbol ▽ indicates connection to the emitter of the transistor Q1.

The control voltage VH for driving the upper transistor Q1 and the control voltage VL for driving the lower transistor Q2 are supplied by means of the single power supply VLS.

An input signal $V_{IN}1$ is accepted by an edge trigger pulse generating circuit P1, and an input signal $V_{IN}2$ is accepted by a controller 2. The input signals $V_{IN}1$ and $V_{IN}2$ are based on the control voltage VL.

The edge trigger pulse generating circuit PG1, in response to the input signal $V_{IN}1$, outputs turn-on pulses to a level shifting circuit $L_{ON}$ for turn-on operation at such time intervals as to turn on the transistor Q1 (H level rising timings of the input signal $V_{IN}1$), and also outputs turn-off pulses to a level shifting circuit $L_{OFF}$ for turn-off operation at such time intervals as to turn off the transistor Q1 (L level falling timings of the input signal $V_{IN}1$).

The level shifting circuit $L_{ON}$ level-shifts the turn-on pulses based on the control voltage VL into a signal based on the control voltage VH to output the signal to a set input S1 of a flip-flop FF1. Likewise, the level shifting circuit $L_{OFF}$ shifts the level of the turn-off pulses based on the control voltage VL into a signal based on the control voltage VH to output the signal to a first input of an OR gate G1.

A control power supply voltage drop protecting circuit UV1 monitors the control voltage VH to output a control voltage drop detection signal SM to a second input of the OR gate G1, the control voltage drop detection signal SM being H when the control voltage VH decreases abnormally and being L in other cases.

A current sensor CS1 converts a current flowing in a sense electrode of the transistor Q1 and outputs a sense voltage VS, which is applied to the positive input of an overcurrent protecting circuit OC1 including a comparator. The overcurrent protecting circuit OC1 has a negative input receiving a reference voltage VR and outputs an overcurrent detection signal SO to a third input of the OR gate G1.

The flip-flop FF1 has a reset input R1 receiving the output of the OR gate G1 and a Q-output Q01 connected to the input of a driver DR1. The output of the driver DR1 is applied to the gate of the transistor Q1.

An output voltage detecting circuit VM is also connected to the connecting point U. The output voltage detecting circuit VM monitors and compares a voltage VU at the connecting point U with a predetermined potential to output a potential comparison signal SC of "H"/"L" level to an abnormality detecting circuit FS.

The abnormality detecting circuit FS receives the potential comparison signal SC and the input signal $V_{IN}1$ to output an abnormality signal FO indicating whether or not the transistor Q1 is abnormal in response to the received signals.

The controller 2 performs the drive-control such as on-off control of the transistor Q2 in response to the input signal $V_{IN}2$. A portion 31 enclosed by the dotted line of FIG. 17 is the control circuit for power devices (transistors Q1 and Q2).

In such an arrangement, when the input signal $V_{IN}1$ indicates turn-on, the control voltage VH level "H" is applied to the set input S1 of the flip-flop FF1 through the edge trigger pulse generating circuit P1 and level shifting circuit $L_{ON}$.

As a result, the Q-output Q01 of the flip-flop FF1 goes high, which is applied to the gate of the transistor Q1 through the driver DR1. The transistor Q1 then enters the on-state.

On the other hand, when the input signal $V_{IN}1$ indicates turn-off, the control voltage VH level "H" is applied to the reset input R1 of the flip-flop FF1 through the edge trigger pulse generating circuit PG1, level shifting circuit $L_{OFF}$ and OR gate G1.

As a result, the Q-output Q01 of the flip-flop FF1 goes low, which is applied to the gate of the transistor Q1 through the driver DR1. The transistor Q1 then enters the off-state.

When the transistor Q1 is in an overcurrent supply state and the sense voltage VS exceeds the reference voltage VR, the overcurrent detection signal SO of the overcurrent protecting circuit OC1 goes high, which is applied to the reset input R1 of the flip-flop FF1 through the OR gate G1.

As a result, the Q-output Q01 of the flip-flop FF1 goes low, which is applied to the gate of the transistor Q1 through the driver DR1. The transistor then enters the off-state and is released from the overcurrent supply state.

When the control voltage VH decreases abnormally, the control voltage drop detection signal SM goes high, which is applied to the reset input R1 of the flip-flop FF1 through the OR gate G1.

As a result, the Q-output Q01 of the flip-flop FF1 goes low, which is applied to the gate of the transistor Q1 through the driver DR1. The transistor then enters the off-state. The charging of the capacitor CP restarts, and the control voltage VH returns to the normal level.

In the off-state of the transistor Q1, the voltage VU at the connecting point U decreases. When the voltage VU decreases to a level lower than the predetermined potential of the output voltage detecting circuit VM, the potential comparison signal SC changes to "L". If the input signal $V_{IN}1$ indicates the on-state at that time, the abnormality detecting circuit FS judges that the overcurrent supply state of the transistor Q1 or the abnormal decrease in control voltage VH has forced the transistor Q1 to turn off and outputs the abnormality signal FO indicative of abnormalities.

FIG. 18 shows the control circuit for power devices of FIG. 17 which drives a three-phase motor. Referring to FIG. 18, the transistors Q1, Q2 which are power devices, transistors Q3, Q4, and transistors Q5, Q6 are totem-pole connected to each other, and are three-phase bridge connected between the power sources P and N. Inputs of a motor M are connected to connecting points U, V, W of the transistors, respectively.

Flywheel diodes D1 to D6 are connected in antiparallel to the transistors Q1 to Q6, respectively. Outputs of control circuits 31 to 33 for performing controls such as drive or protection of IGBTs are applied to the gates of the transistors Q1 to Q6.

The control circuits 31 to 33 turn on and off the transistors Q1 to Q6 in response to control signals S10 to S30 from a controller 40 including a microcomputer or the like and controls the operation of the motor M.

The elements of FIG. 18 are in the following relation with those of FIG. 17. The elements Q1, Q2, D1, D2 and the control circuit 31 of FIG. 18 are equivalent to those of FIG. 17. The motor M of FIG. 18 is equivalent to the inductive load 1 of FIG. 17. The control signal S10 of FIG. 18 is equivalent to the input signals $V_{IN}1$ and $V_2 2$ of FIG. 17. It is a common practice to integrate the control circuits 31 to 33.

The conventional control circuit for power devices of half-bridge connection having the above-mentioned arrangement has detected the abnormalities of the power devices by monitoring the potential VU at the connecting point U. This presents the problem that it is impossible to determine whether the abnormality indicated by the abnormality signal FO results from the overcurrent supply state of the transistor Q1 or the abnormal decrease of the control voltage VH.

The capacitor CP supplies the control voltage VH of the transistor Q1. During the time the transistor Q1 is on and the potential VU at the connecting point U is high, the capacitor CP discharges, causing the control voltage VH to decrease with time.

Thus, a need has arisen to limit the rated current capacity and maximum on-time of the transistor Q1. This limitation is also disadvantageous in that the input signal $V_{IN}1$ must be set so that the capacitor CP is periodically charged in consideration for the decreasing control voltage VH.

SUMMARY OF THE INVENTION

The present invention is directed to a control circuit for applying a control signal to a control electrode of the power transistor in response to an input signal. The control circuit is driven by a control power voltage applied from a capacitor coupled to a control power source. The power transistor is operable to be turned on and off in response to first and second levels of the control signal, respectively.

According to the present invention, the control circuit comprises: (a) voltage monitor means for monitoring the control power voltage to generate a voltage drop signal when the control power voltage drops below a reference voltage level due to discharge of the capacitor; (b) recovery signal generating means for generating a recovery signal when a predetermined time period has passed after the voltage drop signal had been generated; and (c) signal control means for generating the control signal in response to the input signal and the voltage drop signal. The predetermined time is longer than a time required for re-charging the capacitor by the control power source.

The signal control means comprises: (c-1) first circuit means and (c-2) second circuit means. The first circuit means is operable to provide the second level to the control signal in response to:

1) a first level-transition of input signal; and
2) the voltage drop signal.

The second circuit means is operable to provide the first level to the control signal in response to:

3) a second level-transition of input signal; and
4) the recovery signal.

Since the power transistor is automatically turned on after the predetermined time period has passed, it is not required to carefully select the lasting time of the input signal.

In the control circuit according to the present invention, the power transistor is turned off when the control power voltage is dropped. The off-state is maintained during the predetermined time period in which the capacitor is charged to become ready to supply the control power voltage again. The power transistor is automatically turned on after the predetermined time period, so that it is not necessary to carefully determine the on/off timings of the input signal.

Preferably, the control circuit further comprises: (d) current monitor means for monitoring main current flowing through the power transistor to generate an overcurrent signal when the main current is larger than a reference current value, the signal control means being operable to provide the second level to the control electrode also in response to the overcurrent signal; and (e) first and second output means for outputting the voltage drop signal and the overcurrent signal, respectively.

The reason why the power transistor was turned off can be known by monitoring the voltage drop signal and the overcurrent signal.

In an aspect of the present invention, a control circuit comprises: (a) voltage monitor means for monitoring the control power voltage to generate a voltage drop signal when the control power voltage drops below a reference voltage level; (b) current monitor means for monitoring main current flowing through the power transistor to generate an overcurrent signal when the main current is larger than a reference current value. The current monitor means comprises: (b-1) holding means for holding the overcurrent signal until a cancel signal for cancelling the overcurrent signal is given to the holding means, and the control circuit further comprises: (c) voltage detector means for detecting a voltage level at one of main electrodes of the power transistor to generate a voltage signal indicating the voltage level, the voltage detector means comprising: (c-1) recovery signal generating means for generating a recovery signal when a predetermined first time period has passed after the level of the voltage signal has changed; and (d) signal control means for generating the control signal in response to the input signal, the voltage drop signal and the overcurrent signal. The first time period is longer than a time required for re-charging the capacitor by the control power source.

The signal control means comprises: (d-1) first circuit means for providing the first level to the control electrode in response to: a first-type level-transition of the input signal; and the recovery signal; (d-2) second circuit means for providing the second level to the control electrode in response to: a second-type level-transition of the input signal; the voltage drop signal; and the recovery signal; the voltage drop signal and the overcurrent signal, and (d-3) means for detecting the voltage signal when a predetermined second time period has passed after the level of the voltage signal has changed, to selectively generate a first output signal and a second output signal according to the level of the voltage signal detected. The second time period is longer than the first time period.

The control circuit is provided with: (e) first and second output means for outputting the first and the second output signals, respectively.

The present invention is also directed to a level shifter for converting first and second input signals of a first voltage level to first and second output signals of a second voltage level.

According to the present invention, the level shifter comprises: (a) a first signal converter for converting the first input signal to a first pulse having a first pulse width; (b) a second signal converter for converting the second input signal to a second pulse having a second pulse width; (c) a signal synthesizer for synthesizing the first and second pulses to generate a synthesized signal; (d) a transistor having a control electrode to which the synthesized signal is supplied; and (e) an output signal generator coupled to a main electrode of the transistor for detecting a time period during which the transistor is in a conductive state to generate the first output signal when the time period corresponds to the first pulse width and to generate the second output signal when the time period corresponds to the second pulse width.

The level shifter requires only one transistor, whereby the same can be integrated on a small area on a semiconductor chip.

Another level shifter according to the present invention comprises: (a) a first signal converter for generating a first current in response to the first input signal; (b) a second signal converter for generating a second current in response to the second input signal; (c) a current mirror circuit for receiving the first and second currents and outputting a current signal equivalent to the sum of the first and second currents; (d) current/voltage converter means for converting the current signal into a voltage signal; and (e) output signal generator means for comparing the voltage signal with first and second reference voltages to generate the first and second output signals, respectively.

Accordingly, an object of the present invention is to provide a control circuit for power devices which eliminates the necessity to carefully determine the on/off control timings in an input signal.

Another object is to correctly recognize what abnormality was caused in controlling the power transistor.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
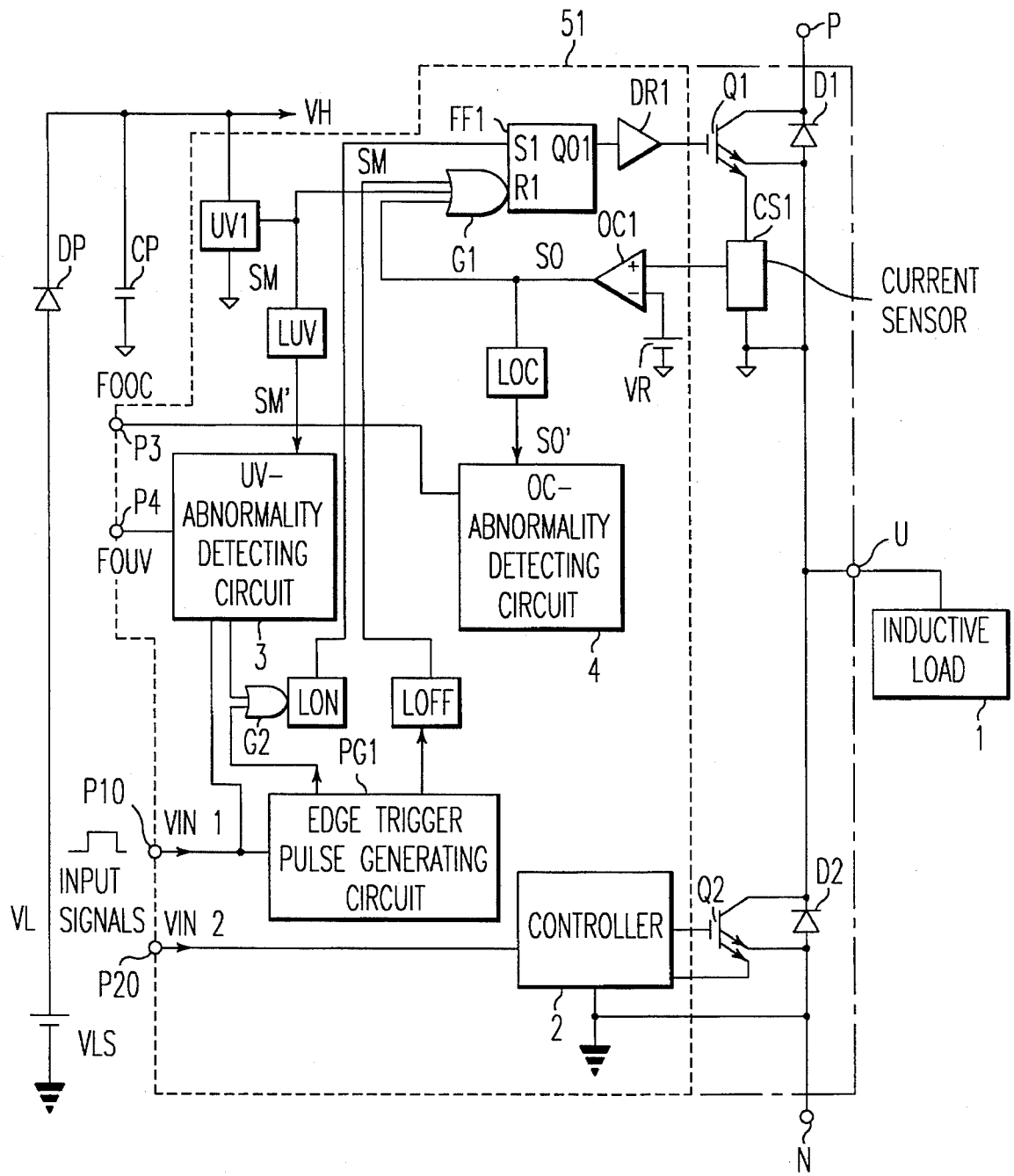
FIG. 1 is a circuit diagram of a control circuit for power devices according to a first preferred embodiment of the present invention.

FIG. 1 is a circuit diagram of a control circuit for power devices according to a first preferred embodiment of the present invention. Referring to FIG. 1, transistors Q1 and Q2 which are power devices such as IGBTs are connected between main power sources P and N in the form of a totem-pole, and flywheel diodes D1 and D2 are connected in antiparallel to the transistors Q1 and Q2, respectively. An inductive load 1 is connected to a connecting point U of the emitter of the transistor Q1 and the collector of the transistor Q2.

The transistors Q1 and Q2 are driven and controlled on different control voltages VH and VL, respectively. The control voltage VL based on the emitter potential (ground level) of the transistor Q2 is supplied from the positive electrode of a power supply VLS having a grounded negative electrode.

The control voltage VH based on the emitter potential of the transistor Q1 is supplied from the positive electrode of a capacitor CP having a negative electrode connected to the emitter of the transistor Q1. The positive electrode of the capacitor CP is connected to the cathode of a diode DP, and the negative electrode thereof is connected to the emitter of the transistor Q1. The electrical charge is provided from the power supply VLS to the capacitor CP through the diode DP is used as the control voltage VH.

The anode of the diode DP is connected to the positive electrode of the power supply VLS. In the following drawings, the symbol ▽ indicates connection to the emitter of the transistor Q1.

The control voltage VH for driving the upper transistor Q1 and the control voltage VL for driving the lower transistor Q2 are supplied by means of the signal power supply VLS.

An input signal $V_{IN}1$ from a first external input terminal P10 is accepted by an edge trigger pulse generating circuit PG1, and an input signal $V_{IN}2$ from a second external input terminal P20 is accepted by a controller 2. The input signals $V_{IN}1$ and $V_{IN}2$ are based on the control voltage VL.

The edge trigger pulse generating circuit PG1, in response to the input signal $V_{IN}1$, outputs turn-on pulses to a level shifting circuit $L_{ON}$ for turn-on operation at such time intervals as to turn on the transistor Q1 (H level rising timings of the input signal $V_{IN}1$), and outputs turn-off pulses to a level shifting circuit $L_{OFF}$ for turn-off operation at such time intervals as to turn off the transistor Q1 (L level falling timings of the input signal $V_{IN}1$).

The level shifting circuit $L_{ON}$ level-shifts the turn-on pulses based on the control voltage VL into a signal based on the control voltage VH to output the signal to a set input S1 of a flip-flop FF1. Likewise, the level shifting circuit $L_{OFF}$ level-shifts the turn-off pulses based on the control voltage VL into a signal based on the control voltage VH to output the signal to a first input of an OR gate G1.

A control power supply voltage drop protecting circuit UV1 monitors the control voltage VH to output a control voltage drop detection signal SM to a second input of the OR gate G1, the control voltage drop detection signal SM being H when the control voltage VH decreases abnormally and being L in other cases.

The control voltage drop detection signal SM of the control power supply voltage drop protecting circuit UV1 is also outputted to a level shifting circuit $L_{UV}$. The level shifting circuit $L_{UV}$ level-shifts the control voltage drop detection signal SM to a control voltage drop detection signal SM' based on the control voltage VL to output the control voltage drop detection signal SM' to a UV-abnormality detecting circuit 3.

The UV-abnormality detecting circuit 3 receives the input signal $V_{IN}1$ and the control voltage drop detection signal SM' and outputs a control voltage abnormal decrease signal FOUV indicative of abnormality/normality from a second external output terminal P4 in response to the input signal $V_{IN}1$ and control voltage drop detection signal SM'.

The UV-abnormality detecting circuit 3 outputs the turn-on pulses to the level shifting circuit $L_{ON}$ through an OR gate G2 after a slight delay time has elapsed when the control voltage abnormal decrease signal FOUV indicates the abnormality.

A current sensor CS1 converts a current flowing in a sense electrode of the transistor Q1 into a sense voltage VS, which is applied to the positive input of an overcurrent protecting circuit OC1 including a comparator.

The overcurrent protecting circuit OC1 has a negative input receiving a reference voltage VR and outputs an overcurrent detection signal SO to a third input of the OR gate G1.

The overcurrent detection signal SO of the overcurrent protecting circuit OC1 is also outputted to a level shifting circuit $L_{OC}$. The level shifting circuit $L_{OC}$ level-shifts the overcurrent detection signal SO to an overcurrent detection signal SO' based on the control voltage VL to output the overcurrent detection signal SO' to an OC-abnormality detecting circuit 4.

The OC-abnormality detecting circuit 4 outputs an overcurrent abnormality signal FOOC indicative of abnormality/normality from a first external output terminal P3 in response to the "H"/"L" level of the overcurrent detection signal SO'.

The flip-flop FF1 has a reset input R1 receiving the output of the OR gate G1 and a Q-output Q01 connected to the input of a driver DR1. The output of the driver DR1 is applied to the gate of the transistor Q1.

The controller 2 performs the drive control such as on-off control of the transistor Q2 in response to the input signal $V_{IN}2$ given from the second external input terminal P20. A portion 51 enclosed by the dotted line of FIG. 1 is the control circuit for power devices (transistors Q1 and Q2).

Figure 2:
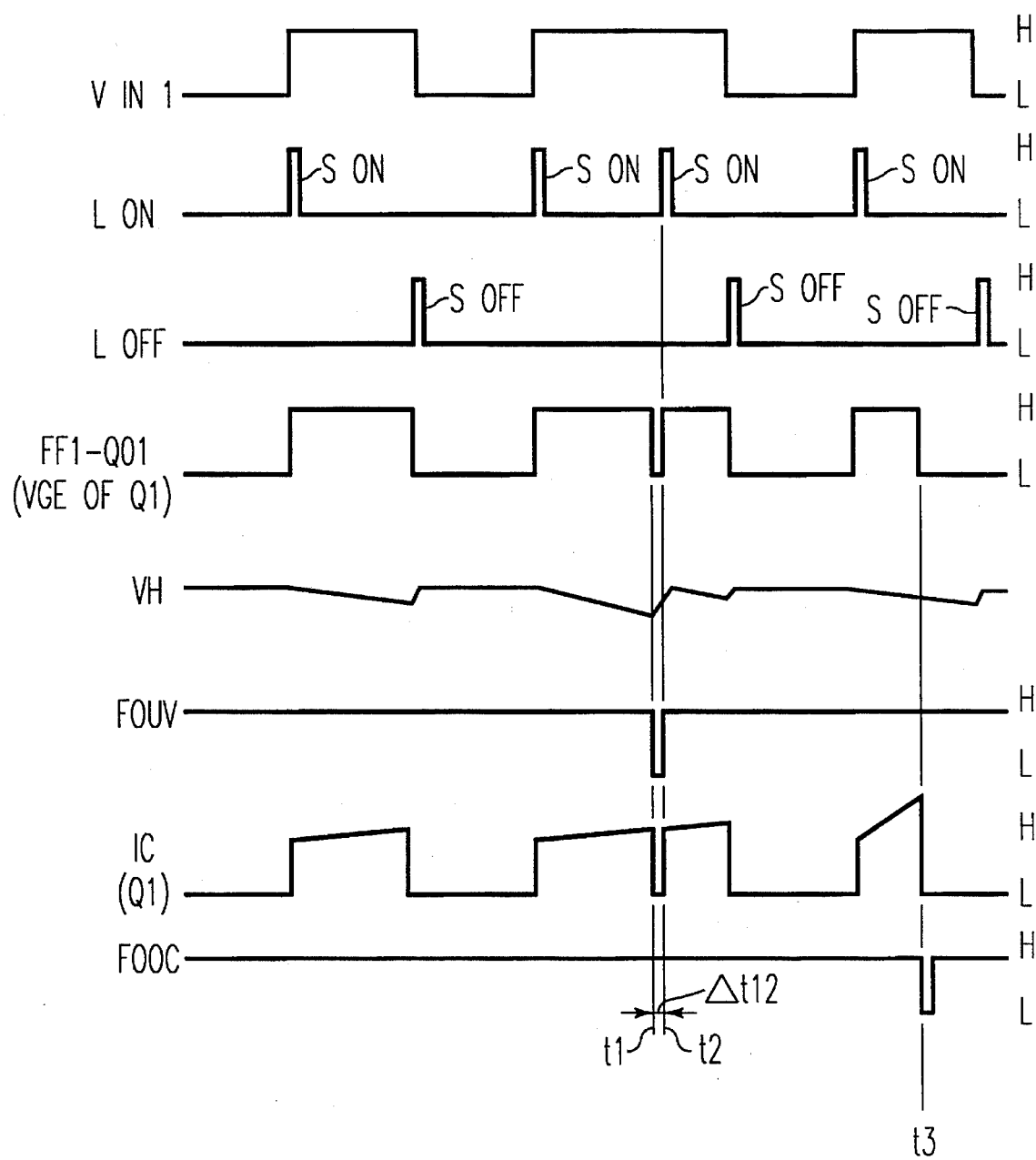
FIG. 2 is a timing chart showing the operation of the control circuit of the first preferred embodiment.

FIG. 2 is a timing chart showing the operation of the control circuit of the first preferred embodiment. The operation of the first preferred embodiment will be discussed below with reference to FIG. 2.

As the input signal $V_{IN}1$ rises to "H" level to indicate turn-on, a turn-on pulse $S_{ON}$ is generated through the edge trigger pulse generating circuit PG1 and level shifting circuit $L_{ON}$, and the control voltage VH level "H" is applied to the set input S1 of the flip-flop FF1. Then the gate voltage $V_{GE}$ of the transistor Q1 goes high and the transistor Q1 turns on.

As the input signal $V_{IN}1$ falls to the "L" level to indicate turn-off, a turn-off pulse $S_{OFF}$ is generated through the edge trigger pulse generating circuit PG1 and level shifting circuit $L_{OFF}$, and the control voltage VH level "H" is applied to the reset input R1 of the flip-flop FF1 through the OR gate G1. Then the gate voltage $V_{GE}$ of the transistor Q1 goes low and the transistor Q1 turns off.

If a discharging phenomenon of the capacitor CP causes the control voltage VH to decrease abnormally at a time t1, the control voltage drop detection signal SM goes high, which is applied to the reset input R1 of the flip-flop FF1 through the OR gate G1. Then the gate voltage $V_{GE}$ of the transistor Q1 goes low, and the transistor Q1 turns off. Consequently, charging of the capacitor CP restarts, so that the control voltage VH returns to the normal level rapidly.

On receipt of the control voltage drop detection signal SM' of "H" level, the UV-abnormality detecting circuit 3 outputs the control voltage abnormal decrease signal FOUV of "L" level indicative of the abnormality.

When the input signal $V_{IN}1$ indicates the on-state ("H") of the transistor Q1 at a time t2 that is later than the time t1 by a short delay time Δt12, the turn-on pulse is applied to the level shifting circuit $L_{ON}$ through the OR gate G2, and the level shifting circuit $L_{ON}$ regenerates the turn-on pulse $S_{ON}$, whereby the transistor Q1 is rapidly returned to the on-state. The short delay time Δt12 is adapted to be a sufficient time period to complete the charging (refresh) of the capacitor CP, which starts by the turn-off of the transistor Q1, and to return the control voltage VH to the normal level.

When, at a time t3, the overcurrent supply state of a current $I_C$ flowing in the transistor Q1 occurs and the sense voltage VS exceeds the reference voltage VR, the overcurrent detection signal SO of the overcurrent protecting circuit OC1 goes high, which is applied to the reset input R1 of the flip-flop FF1 through the OR gate G1. Then the transistor Q1 turns off and is released from the overcurrent supply state.

The OC-abnormality detecting circuit 4 outputs the overcurrent abnormality signal FOOC of "L" level indicative of the abnormality in response to the overcurrent detection signal SO' of "H" level.

In the first preferred embodiment, if the abnormal decrease of the control voltage VH has caused the transistor Q1 to turn off, the capacitor CP is charged until the control voltage VH returns to the normal level and, immediately thereafter, the transistor Q1 is enabled to restart driving, as hereinabove described. Since the charging of the control voltage VH and the drive restart of the transistor Q1 are automatically carried out on detection of the abnormal decrease of the control voltage VH, it is unnecessary to consider the abnormal decrease of the control voltage VH for setting the input signal $V_{IN}1$.

Further, the control voltage abnormal decrease signal FOUV of the UV-abnormality detecting circuit 3 and the overcurrent abnormality signal FOOC of the OC-abnormality detecting circuit 4 are outputted separately. Thus, by verifying these signals, a correct determination may be made as to whether such abnormality that the transistor Q1 has been forced to turn off is caused by the overcurrent supply state or the control voltage abnormal decrease.

<Second Preferred Embodiment>

Figure 3:
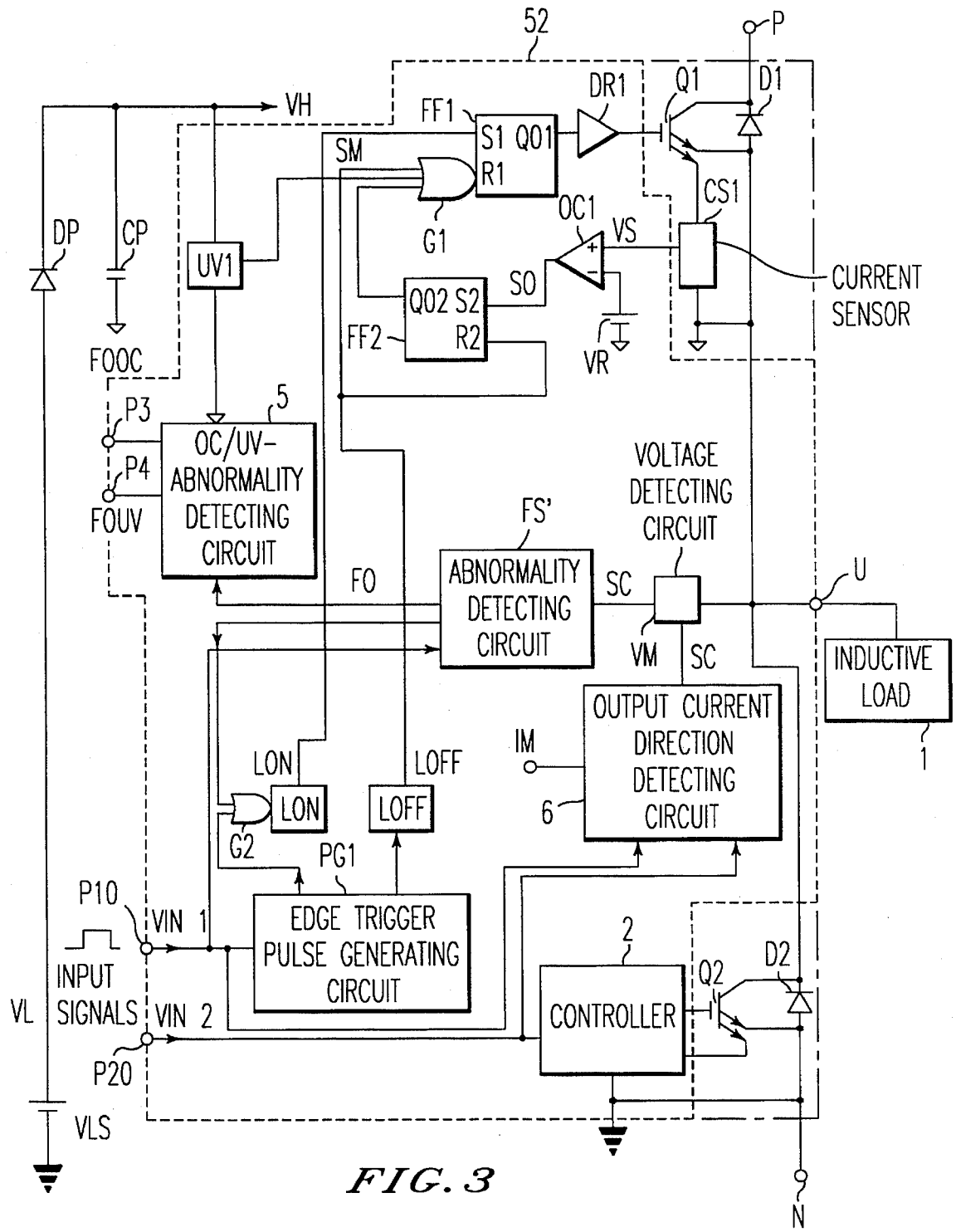
FIG. 3 is a circuit diagram of the control circuit for power devices according to a second preferred embodiment of the present invention.

FIG. 3 is a circuit diagram of the control circuit for power devices according to a second preferred embodiment of the present invention.

Referring to FIG. 3, the transistors Q1 and Q2 which are power devices such as IGBTs are connected between the main power sources P and N in the form of a totem-pole, and the flywheel diodes D1 and D2 are connected in antiparallel to the transistors Q1 and Q2, respectively. The inductive load 1 is connected to the connecting point U of the emitter of the transistor Q1 and the collector of the transistor Q2.

The transistors Q1 and Q2 are driven and controlled on the different control voltages VH and VL, respectively, in the same fashion as the first preferred embodiment.

The input signal $V_{IN}1$ from the first external input terminal P10 is accepted by the edge trigger pulse generating circuit PG1, and the input signal $V_{IN}2$ from the second external input terminal P20 is accepted by the controller 2. The input signals $V_{IN}1$ and $V_{IN}2$ are based on the control voltage VL.

The edge trigger pulse generating circuit PG1, in response to the input signal $V_{IN}1$, outputs the turn-on pulses to the level shifting circuit $L_{ON}$ for turn-on operation through the OR gate G2 at such time intervals as to turn on the transistor Q1, and outputs the turn-off pulses to the level shifting circuit $L_{OFF}$ for turn-off operation at such time intervals as to turn off the transistor Q1.

The level shifting circuit $L_{ON}$ level-shifts the turn-on pulses based on the control voltage VL into a signal based on the control voltage VH to output the signal to the set input S1 of the flip-flop FF1. Likewise, the level shifting circuit $L_{OFF}$ level-shifts the turn-off pulses based on the control voltage VL into a signal based on the control voltage VH to output the signal to the first input of the OR gate G1.

The control power supply voltage drop protecting circuit UV1 monitors the control voltage VH to output the control voltage drop detection signal SM to the second input of the OR gate G1, the control voltage drop detection signal SM being high when the control voltage VH decreases abnormally and being low in other cases.

The current sensor CS1 converts a current flowing in the sense electrode of the transistor Q1 into the sense voltage VS, which is applied to the positive input of the overcurrent protecting circuit OC1 including a comparator. The overcurrent protecting circuit OC1 has a negative electrode receiving the reference voltage VR and outputs the overcurrent detection signal SO to a set input S2 of a flip-flop FF2.

The flip-flop FF2 has a reset input R2 receiving the output of the level shifting circuit $L_{OFF}$ and applies its Q-output to the third input of the OR gate G1.

The flip-flop FF1 has the reset input R1 receiving the output of the OR gate G1 and the Q-output Q01 connected to the input of the driver DR1. The output of the driver DR1 is applied to the gate of the transistor Q1. The flip-flop FF1 operates to give priority to resetting. When the set input S1 and reset input of the flip-flop FF1 are both "H", the flip-flop FF1 performs the reset action to set the Q-output Q01 thereof to "L".

An output voltage detecting circuit VM is also connected to the connecting point U. The output voltage detecting circuit VM monitors and compares a voltage VU at the connecting point U with a predetermined reference potential to output a potential comparison signal SC of "H"/"L" level to an abnormality detecting circuit FS'.

The abnormality detecting circuit FS' receives the potential comparison signal SC and the input signal $V_{IN}1$ to output to an OC/UV-abnormality detecting circuit 5 an abnormality signal FO indicative of an abnormality/normality by means of "L"/"H" level. In addition, the abnormality detecting circuit FS' outputs the turn-on pulses to the level shifting circuit $L_{ON}$ through the OR gate G2 at substantially the same time that it outputs the abnormality signal FO of "H" level.

The OC/UV-abnormality detecting circuit 5 receives the abnormality signal FO. When the abnormality signal FO is "H", the OC/UV-abnormality detecting circuit 5 verifies the signal level of the abnormality signal FO after an elapse of a predetermined time. Then the OC/UV-abnormality detecting circuit 5 sets the overcurrent abnormality signal FOOC to the level ("H") indicative of the abnormality and outputs it to the first external output terminal P3 when the signal level is "H", and sets the control voltage abnormal decrease signal FOUV to the level ("H") indicative of the abnormality and outputs it to the second external output terminal P4 when the signal level is "L".

The potential comparison signal SC of the output voltage detecting circuit VM is also applied to an output current direction detecting circuit 6. The output current direction detecting circuit 6 receives the input signal $V_{IN}1$ and the input signal $V_{IN}2$ to the controller 2 to output an output direction indication signal IM indicative of an output current direction at the connecting point U in response to the potential comparison signal SC and the input signals $V_{IN}1$ and $V_{IN}2$.

The controller 2 performs the drive control such as on-off control of the transistor Q2 in response to the input signal $V_{IN}2$ given from the second external input terminal P20. A portion 52 enclosed by the dotted line of FIG. 3 is the control circuit for power devices (transistors Q1 and Q2).

Figure 4:
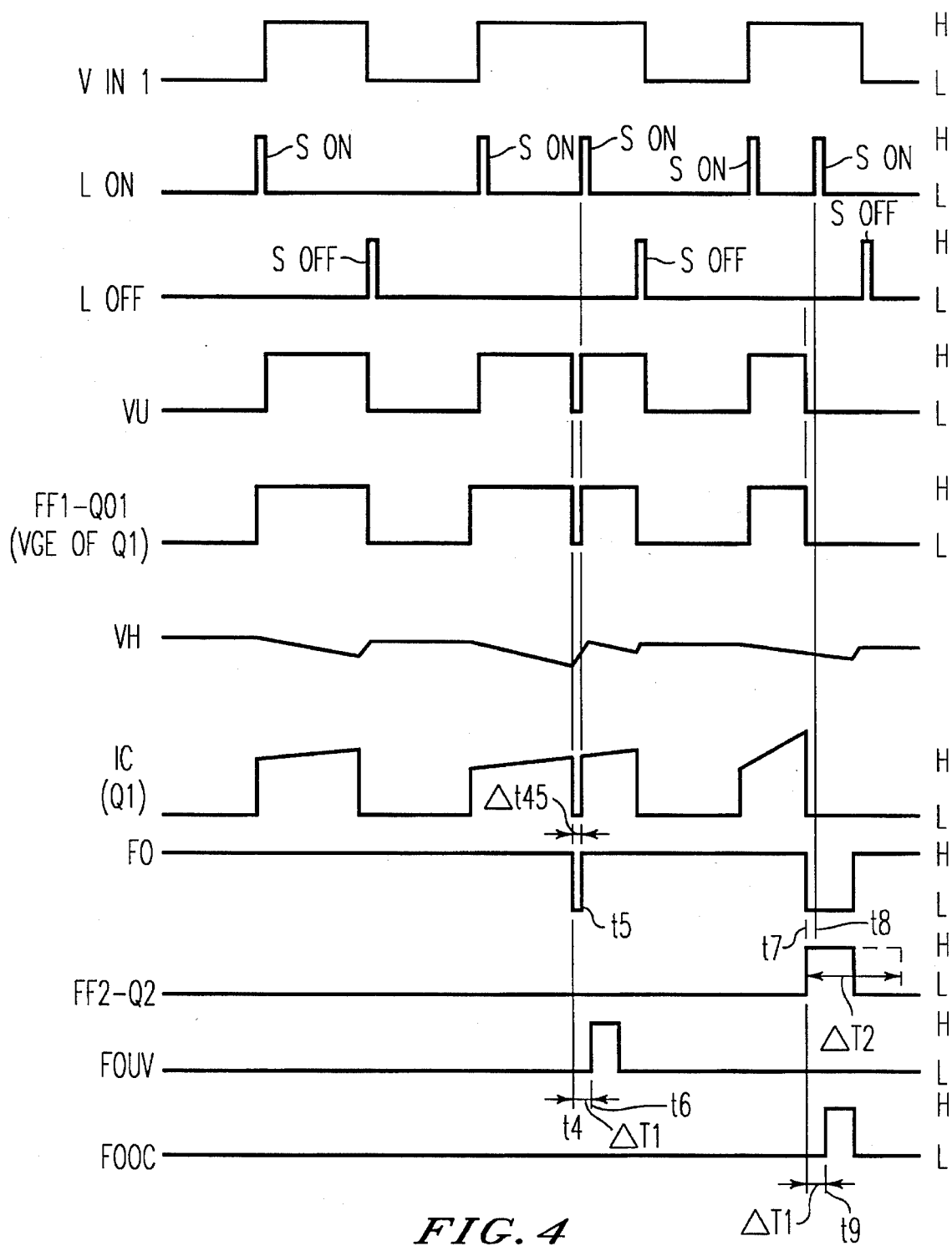
FIG. 4 is a timing chart showing the operation of the control circuit of the second and third preferred embodiments.

FIG. 4 is a timing chart showing the operation of the control circuit of the second preferred embodiment. The operation of the second preferred embodiment will be discussed hereinafter with reference to FIG. 4.

As the input signal $V_{IN}1$ rises to "H" level to indicate turn-on, the turn-on pulse $S_{ON}$ is generated through the edge trigger pulse generating circuit PG1 and level shifting circuit $L_{ON}$, and the control voltage VH level "H" is applied to the set input S1 of the flip-flop FF1. Then the gate voltage $V_{GE}$ of the transistor Q1 goes high and the transistor Q1 turns on.

As the input signal $V_{IN}1$ falls to "L" level to indicate turn-off, the turn-off pulse $S_{OFF}$ is generated through the edge trigger pulse generating circuit PG1 and level shifting circuit $L_{OFF}$, and the control voltage VH level "H" is applied to the reset input R1 of the flip-flop FF1 through the OR gate G1. Then the gate voltage $V_{GE}$ of the transistor Q1 goes low and the transistor Q1 turns off.

When the control voltage VH decreases abnormally at a time t4, the control voltage drop detection signal SM (FIG. 3) goes high, which is applied to the reset input R1 of the flip-flop FF1 through the OR gate G1. Then the gate voltage $V_{GE}$ of the transistor Q1 goes low and the transistor Q1 turns off. As a result, charging of the capacitor CP restarts, and the control voltage VH returns to the normal level rapidly.

Simultaneously, the potential VU at the connecting point U falls to "L", and the output voltage detecting circuit VM outputs the potential comparison signal SC (FIG. 3) indicative of the abnormality to the abnormality detecting circuit FS'. The abnormality detecting circuit FS', in turn, outputs the abnormality signal FO of "L" level indicative of the abnormality and applies the turn-on pulse $S_{ON}$ to the level shifting circuit $L_{ON}$ through the OR gate G2 to regenerate the turn-on pulses from the level shifting circuit $L_{ON}$ at a time t5 which is later than the time t4 by a short delay time Δt45. The short delay time Δt45 is adapted to be a sufficient time period to complete the charging (refresh) of the capacitor CP, which starts by the turn-off of the transistor Q1, and to return the control voltage VH to the normal level.

Consequently, "H" level is applied to the set input of the flip-flop FF1, so that the gate voltage $V_{GE}$ of the transistor Q1 goes high and the transistor Q1 returns to the on-state rapidly.

The OC/UV-abnormality detecting circuit 5 verifies the signal level of the abnormality signal FO at a time t6 which is later than the time t4 by a judgement delay time ΔT1. At the time t6, since the transistor Q1 is on and accordingly the potential at the connecting point U has been returned to "H", the abnormality signal FO is at "H" level. The OC/UV-abnormality detecting circuit 5 inputs the "H" level of the signal FO to thereby judge that the abnormal decrease of the control voltage VH has forced the transistor Q1 to turn off at the time t4, to hold the control voltage abnormal decrease signal FOUV at "H" level for a predetermined period of time since the time t6.

When the current $I_C$ flowing in the transistor Q1 increases to provide the overcurrent supply state and the sense voltage VS exceeds the reference voltage VR at a time t7, the overcurrent detection signal SO of the overcurrent protecting circuit OC1 goes high. The overcurrent detection signal SO of "H" level is applied to the set input S2 of the flip-flop FF2, which in turn applies the Q-output Q02 of "H" level to the reset input R1 of the flip-flop FF1 through the OR gate G1. Then, the gate voltage $V_{GE}$ of the transistor Q1 goes low and the transistor Q1 turns off and is released from the overcurrent supply state.

Simultaneously, the potential at the connecting point U falls to "L", and the output voltage detecting circuit VM outputs the potential comparison signal SC indicative of the abnormality to the abnormality detecting circuit FS'. The abnormality detecting circuit FS', in turn, outputs the abnormality signal FO of "L" level indicative of the abnormality and applies the turn-on pulse to the level shifting circuit $L_{ON}$ through the OR gate G2 to regenerate the turn-on pulse $S_{ON}$ from the level shifting circuit $L_{ON}$ at a time t8 immediately after the time t7.

At the time t8, however, the Q-output Q02 of the flip-flop FF2 is "H", which continues being applied to the reset input R1 of the flip-flop FF1. Since the flip-flop FF1 gives priority to resetting, the gate voltage $V_{GE}$ of the transistor Q1 is still "L" and the transistor Q1 is held off even if the "H" level is applied to the set input S1 of the flip-flop FF1.

The OC/UV-abnormality detecting circuit 5 verifies the signal level of the abnormality signal FO at a time t9 which is later than the time t7 by the judgement delay time ΔT1. At the time t9, since the transistor Q1 is off and the potential VU at the connecting point U is "L", the abnormality signal FO is at "L" level.

Thus the OC/UV-abnormality detecting circuit 5 judges that the overcurrent supply state of the transistor Q1 has forced the transistor Q1 to turn off at the time t7, to hold the control voltage abnormal decrease signal FOOC at "H" level for a predetermined period of time since the time t9.

In the second preferred embodiment, if the abnormal decrease of the control voltage VH has caused the transistor Q1 to turn off, the capacitor CP is charged until the control voltage VH returns to the normal level and, immediately thereafter, the transistor Q1 is enabled to restart driving. In the same fashion as the first preferred embodiment, the charging of the control voltage VH and the drive restart of the transistor Q1 are carried out automatically without consideration for the abnormal decrease of the control voltage VH for setting the input signal $V_{IN}1$.

The OC/UV-abnormality detecting circuit 5, on receiving the abnormality signal FO of "L" level from the abnormality detecting circuit FS', applies the turn-on pulse to the set input S1 of the flip-flop FF1 and thereafter verifies the potential VU at the connecting point U, to judge what has forced the transistor Q1 to turn off as a function of the verification result. Based on the judgement, the OC/UV-abnormality detecting circuit 5 separately outputs the control voltage abnormal decrease signal FOUV and the overcurrent abnormality signal FOOC. The verification of these signals enables a correct determination to be made as to whether the overcurrent supply state or the abnormal decrease of the control voltage has forced the transistor Q1 to turn off.

The second preferred embodiment which may omit the level shifting circuits $L_{UV}$ and $L_{OC}$ unsuitable for integration is more suitable for integration than the first preferred embodiment.

Further, the output current direction detecting circuit 6 outputs the output direction indication signal IM indicative of the output signal direction at the connecting point U in response to the potential comparison signal SC and the input signals $V_{IN}1$ and $V_{IN}2$. This permits the output direction indication signal IM to identify the output signal direction at the connecting point U.

Thus, an external controller such as a microcomputer may output more suitable control input signals (input signals $V_{IN}1$, $V_{IN}2$ and the like) for controlling the power devices by referring to the output direction indication signal IM.

In the second preferred embodiment, if an input signal $V_{IN}$ indicative of turn-off is inputted immediately after the turn-off of the transistor Q1 due to overcurrent abnormal supply, the turn-off pulse of "H" level is applied to the reset input R2 of the flip-flop FF2 through the edge trigger pulse generating circuit PG1 and level shifting circuit $L_{OFF}$, whereby the Q-output of the flip-flop FF2 falls to "L". As a result, the Q-output Q01 of the flip-flop FF1 which gives priority to resetting is released from the "L" fixed state.

The release of the Q-output Q01 of the flip-flop FF1 from the "L" fixed state, if generated during the abnormality judging period (corresponding to ΔT1 of FIG. 4) of the OC/UV-abnormality detecting circuit 5, might possibly cause the timing of the turn-off pulse by the abnormality detecting circuit FS' to set the flip-fop FF1.

In the second preferred embodiment, there is in the worst case the danger that the OC/UV-abnormality detecting circuit 5 indicates that the abnormal decrease of the control voltage VH has forced the transistor Q1 to turn off although, in fact, the overcurrent abnormal supply has done so. A third preferred embodiment of the present invention eliminates the danger of the false judgement.

<Third Preferred Embodiment>

Figure 5:
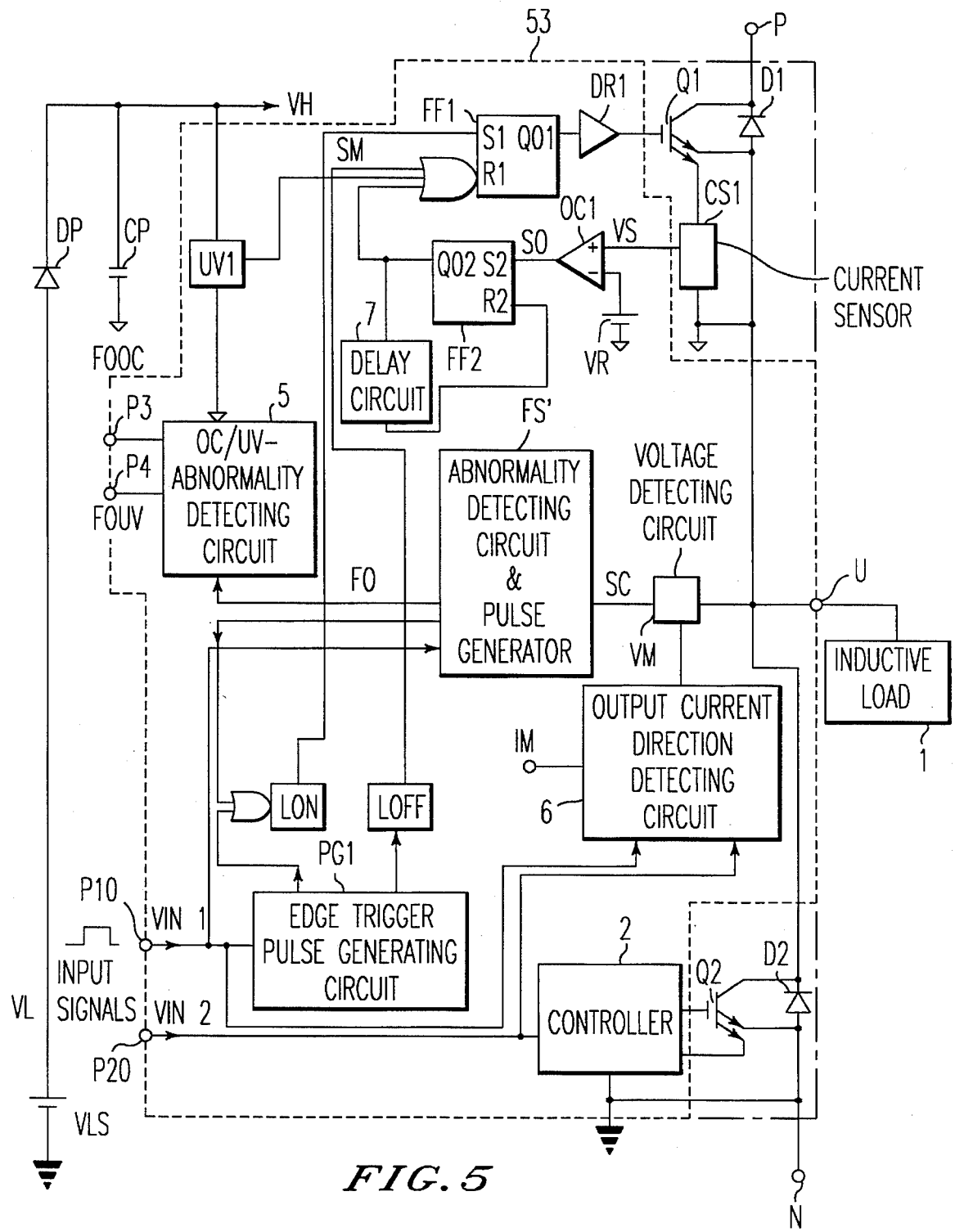
FIG. 5 is a circuit diagram of the control circuit for power devices according to the third preferred embodiment of the present invention.

FIG. 5 is a circuit diagram of the control circuit for power devices according to a third preferred embodiment of the present invention.

Referring to FIG. 5, the structure of the third preferred embodiment is basically identical with that of the second preferred embodiment except that the Q-output Q02 of the flip-flop FF2 is fed back to the reset input R2 thereof through a delay circuit 7 (delay time ΔT2) in the third preferred embodiment although the output of the level shifting circuit $L_{OFF}$ is applied to the reset input R2 of the flip-flop FF2 in the second preferred embodiment. The delay time ΔT2 is sufficiently longer than the judgement delay time ΔT1.

On outputting the Q-output Q02 of "H" level, the flip-flop FF2 is reset after an elapse of the delay time ΔT2 of the delay circuit 7, so that the Q-output Q02 thereof falls automatically to "L". A portion 53 enclosed by the dotted line of FIG. 5 is the control circuit for power devices (transistors Q1 and Q2). Other arrangements of the third preferred embodiment are identical with those of the second preferred embodiment, and the description thereof will be omitted herein.

Referring to FIG. 4, the overcurrent protection of the third preferred embodiment will be discussed below which is different from that of the second preferred embodiment.

When, at a time t7, the transistor Q1 enters the overcurrent supply state and the sense voltage VS exceeds the reference voltage VR, the overcurrent detection signal SO of the overcurrent protecting circuit OC1 goes high, which is applied to the set input S2 of the flip-flop FF2. The Q-output Q02 of the flip-flop FF2 then goes high, which is applied to the reset input R1 of the flip-flop FF1 through the OR gate G1. Thus the gate voltage $V_{GE}$ of the transistor Q1 goes low and the transistor Q1 turns off and is released from the overcurrent supply state.

Simultaneously, the potential at the connecting point U falls to "L", and the output voltage detecting circuit VM outputs the potential comparison signal SC indicative of the abnormality to the abnormality detecting circuit FS'. The abnormality detecting circuit FS' outputs the abnormality signal FO of "L" level indicative of the abnormality and applies the turn-on pulse to the level shifting circuit $L_{ON}$ through the OR gate G2 to regenerate the turn-on pulse $S_{ON}$ from the level shifting circuit $L_{ON}$ at the time t8 immediately following the time t7.

At the time t8, however, the delay time ΔT2 of the delay circuit 7 has not elapsed since the time t7, and the flip-flop FF2 has not yet been reset. Thus the Q-output Q02 of the flip-flop FF2 is "H" which continues being applied to the reset input R1 of the flip-flop FF1. Despite the continuous application of the "H" level signal to the set input S1 of the flip-flop FF1, the gate voltage $V_{GE}$ of the transistor Q1 is held at "L" level and the transistor Q1 is held off since the flip-flop FF1 gives priority to resetting.

The OC/UV-abnormality detecting circuit 5 verifies the signal level of the abnormality signal FO at the time t9 which is later than the time t7 by the judgement delay time ΔT1. At the time t9, the transistor Q1 is off and the potential VU at the connecting point U is "L". The abnormality signal FO is accordingly "L".

The OC/UV-abnormality detecting circuit 5 judges that the overcurrent supply state of the transistor Q1 has forced the transistor Q1 to turn off at the time t7, to set the control voltage abnormal decrease signal FOOC to "H" for a predetermined period of time from the time t9.

As hereinabove described, when the overcurrent abnormal supply causes the transistor Q1 to turn off, the Q-output Q01 of the flip-flop FF1 is completely fixed to "L" for the time period ΔT2 which is sufficiently longer than the judgement delay time ΔT1 of the OC/UV-abnormality detecting circuit 5 in the third preferred embodiment, preventing the OC/UV-abnormality detecting circuit 5 from mistaking the overcurrent supply abnormality for the control voltage decrease abnormality.

<Level Shifting Circuit (1)>

Figure 6:
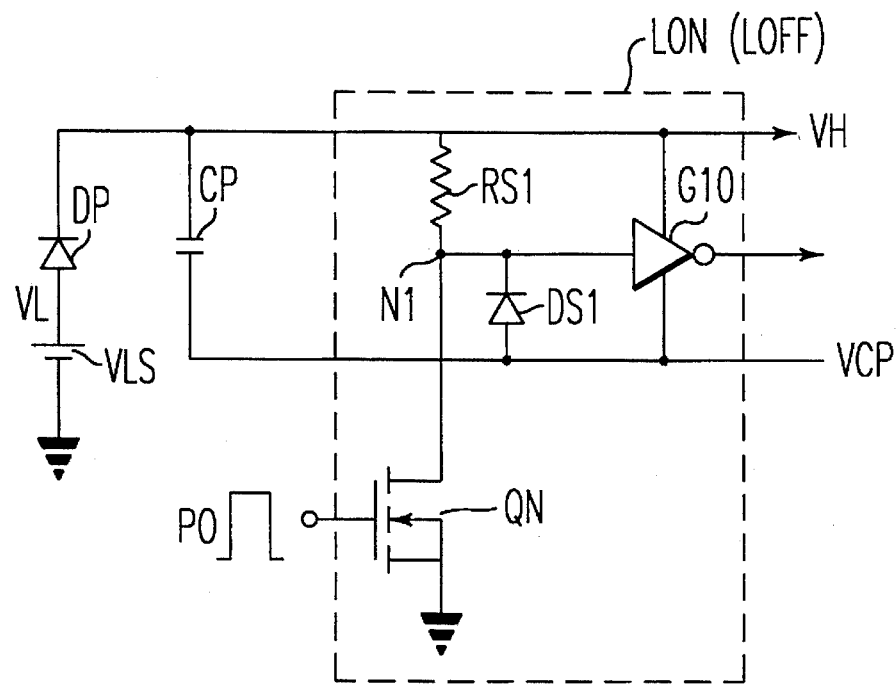
FIGS. 6 to 11 are circuit diagrams of first to sixth level shifting circuits, respectively.

FIG. 6 is a circuit diagram showing the internal structure of the level shifting circuit $L_{ON}$ employed in the first to third preferred embodiments. Since the level shifting circuit $L_{OFF}$ has the same structure, only the level shifting circuit $L_{ON}$ will be described hereinafter as representative.

The level shifting circuit $L_{ON}$ includes an N-channel MOS transistor QN of high breakdown voltage (not less than 100 V), a resistor RS1, a diode DS1, and an inverter G10, as shown in FIG. 6. The resistor RS1 and the transistor QN are provided between the control voltage VH and the ground level. A turn-on pulse PO from the edge trigger pulse generating circuit PG1 is applied to the gate of the transistor QN.

The input of the inverter G10 and the cathode of the diode DS1 are connected to a node N1 between the resistor RS1 and transistor QN. The anode of the diode DS1 is connected to a negative electrode of the capacitor CP for outputting the control voltage VH. The voltage VCP of the negative electrode of the capacitor CP will be referred to as a capacitor GND voltage VCP hereinafter.

The voltages given from the positive and negative electrodes of the capacitor CP set the "H" and "L" levels of the inverter G10 whose output is the output of the level shifting circuit $L_{ON}$.

On receipt of the turn-on pulse PO of "H" level specified by the control voltage VL, the transistor QN turns on, and the potential at the node N1 goes low, the output of the inverter G10 being "H" which is specified by the control voltage VH. In other cases, the transistor QN is off, and the potential at the node N1 is "H", the output of the inverter G10 being "L" which is specified by the capacitor GND voltage VCP.

The level shifting circuits $L_{ON}$ and $L_{OFF}$ are formed separately for the following reason:

In FIG. 6, the conduction of the N-channel transistor QN of high breakdown voltage causes a drain current flow with the drain-source voltage of the transistor QN to increase, resulting in an extremely large amount of consumed current due to the conduction of the transistor QN. A simple correspondence of the on- and off-states of the transistor QN to the on- and off-information causes an undesirable, long-time on-state of the transistor QN.

To avoid the undesirable state, the level shifting circuit $L_{ON}$ for turn-on operation and the level shifting circuit $L_{OFF}$ for turn-off operation are used to independently transmit the turn-on and turn-off information. Further, by limiting the pulse width of a signal for conduction of the transistor QN, the drain current and conducting time of the transistor QN are limited for reduction in power consumption.

<Level Shifting Circuit (2)>

Figure 7:
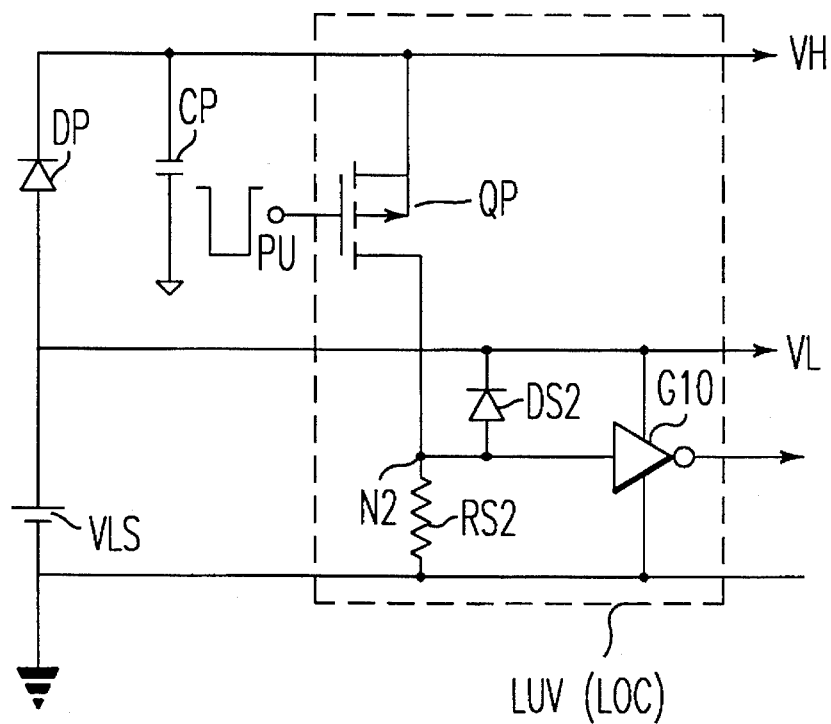

FIG. 7 is a circuit diagram showing the internal structure of the level shifting circuit $L_{UV}$ employed in the first preferred embodiment. Since the level shifting circuit $L_{OC}$ has the same internal structure, only the level shifting circuit $L_{UV}$ will be described hereinafter as representative.

The level shifting circuit $L_{UV}$ includes a P-channel MOS transistor QP of high breakdown voltage, a resistor RS2, a diode DS2, and the inverter G10, as shown in FIG. 7. The transistor QP and the resistor RS2 are provided between the control voltage VH and the ground level. A pulse PU from the control power supply voltage drop protecting circuit UV1 is applied to the gate of the transistor QP.

The input of the inverter G10 and the anode of the diode DS2 are connected to a node N2 between the resistor RS and transistor QP. The cathode of the diode DS2 is connected to a positive electrode of the power supply VLS.

The voltages given from the positive and negative electrodes of the power supply VLS set the "H" and "L" levels of the inverter G10 whose output is the output of the level shifting circuit $L_{UV}$.

On receipt of the pulse PU of "L" level, the transistor QP turns on, and the potential at the node N2 goes high, the output of the inverter G10 being "L" at ground level. In other cases, the transistor QP is off, and the potential at the node N2 is "L", the output of the inverter G10 being "H" specified by the control voltage VL.

<Level Shifting Circuit (3)>

High breakdown voltage devices (transistors) for level shifting are large in size. For cost reduction of high breakdown voltage ICs, it is rather desirable in terms of integration to reduce the number of high breakdown voltage transistors for level shifting to be used.

In the first to third preferred embodiments, for example, since at least two level shifting circuits ($L_{ON}$ and $L_{OFF}$) are needed, two high breakdown voltage transistors are required to form the level shifting circuits ($L_{ON}$ and $L_{OFF}$) in the arrangement of FIG. 6.

Figure 8:
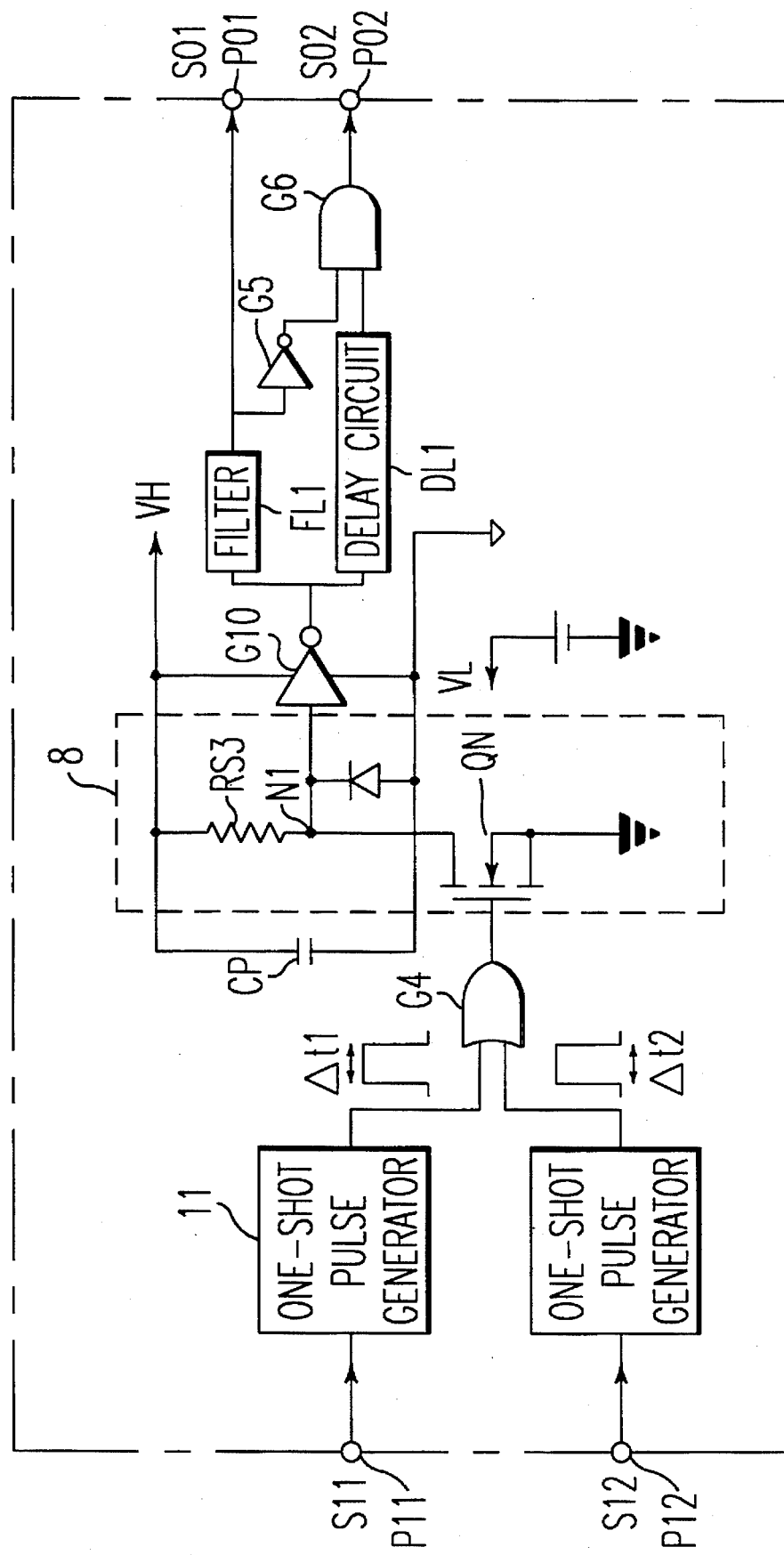

FIG. 8 is a circuit diagram of a first arrangement wherein the level shifting circuits $L_{ON}$ and $L_{OFF}$ are formed with one high breakdown voltage transistor. A level shifting base portion 8 including a resistor RS3, a diode DS3 and transistor QN, the capacitor CP, the inverter G10, the control voltage VH, and the control voltage VL of FIG. 8 are identical with those of the level shifting circuit $L_{ON}$ of FIG. 6, and the detailed description thereof will be omitted herein.

Referring to FIG. 8, a one-shot pulse generator 11 receives an input signal S11 corresponding to the turn-on signal from a first input terminal P11, whereas a one-shot pulse generator 12 receives an input signal S12 corresponding to the turn-off signal from a second input terminal P12. The one-shot pulse generator 11 waveform-reshapes the rising of the input signal S11 into an "H" level signal of pulse width $\Delta t1$, which is outputted to an OR gate G4. The one-shot pulse generator 12 waveform-reshapes the rising of the input signal S12 into an "H" level signal of pulse width $\Delta t2$ ($<\Delta t1$), which is outputted to the OR gate G4.

The output of the OR gate G4 is applied to the gate of the N-channel MOS transistor of high breakdown voltage. The "H" level of the OR gate G4 is set to a level which permits a predetermined drain current to flow in the transistor QN.

When the input of the OR gate G4 is "H", the transistor QN is on, and the potential at the node N1 is "L" because of the voltage drop by the resistor RS3. The duration of this state is the time period $\Delta t1$ at the rising of the input signal S11 and is the time period $\Delta t2$ at the rising of the input signal S12.

The inverter G10 inverts the "L" level potential into "H" level which is outputted to a filter FL1 and a delay circuit DL1. The filter FL1 performs a filtering processing on the "H" level signal by means of a time constant $\Delta t3$ ($\Delta t2<\Delta t3<\Delta t1$). The delay circuit DL1 delays an input signal by the delay time $\Delta t3$. The output of the filter FL1 is an output signal S01 corresponding to the input signal S11, the output signal S01 being outputted from a first output terminal P01. The output of the filter FL1 is also applied to the input of an inverter G5.

The output of the delay circuit DL1 and the output of the inverter G5 are applied to an AND gate G6, which in turn outputs an output signal S02 corresponding to the input signal S12, the output signal S02 being outputted from a second external terminal P02. The "H" and "L" levels of the inverter G5 and AND gate G6 are specified by the control voltage VH and capacitor GND voltage VCP (not shown).

When the input signal S11 rises, since the "H" output period of the inverter G10 is $\Delta t1$, the output signal S01 is "H" specified by the control voltage VH, and the output signal S02 is "L" specified by the capacitor GND voltage VCP. When the input signal S12 rises, since the output period of the inverter G10 is $\Delta t2$, the output signal S02 is "H" specified by the control voltage VH, and the output signal S01 is "L" specified by the capacitor GND voltage VCP.

The level shifting circuit, as described above, is adapted to select the two output signals S01 and S02 by judging which one of the two input signals S11 and S12 rises as a function of the difference in "H" pulse width of the inverter G10. This achieves the level shifting circuit adapted for two input signals using only one high breakdown voltage transistor.

In applications of this method, a level shifting circuit adapted for three or more input signals may be achieved using only one high breakdown voltage transistor.

<Level Shifting Circuit (4)>

Figure 9:
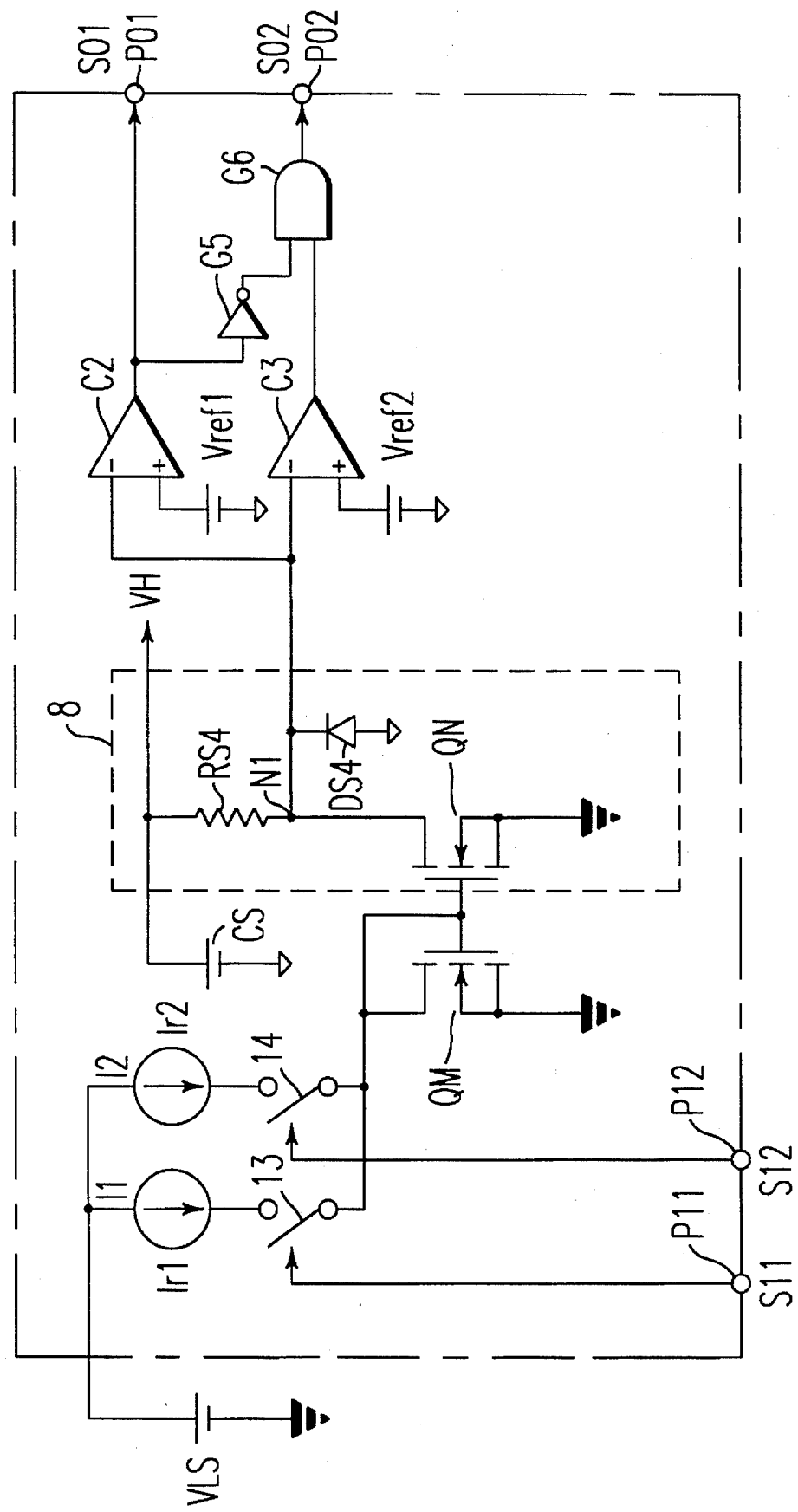

FIG. 9 is a circuit diagram of a second arrangement wherein the level shifting circuits $L_{ON}$ and $L_{OFF}$ are formed with one high breakdown voltage transistor. The level shifting base portion 8 including a resistor RS4, a diode DS4 and transistor QN, the capacitor CP, the control voltage VH, and the control voltage VL of FIG. 9 are identical with those of the level shifting circuit $L_{ON}$ of FIG. 6, and the detailed description thereof will be omitted herein.

Referring to FIG. 9, the N-channel MOS transistor of high breakdown voltage of the level shifting base portion 8 and an N-channel transistor QM of low breakdown voltage are current mirror connected to each other. The drain of the transistor QM is connected to current sources Ir1 and Ir2 through switches 13 and 14. The current sources Ir1 and Ir2 are connected to the positive electrode of the power supply VLS, the supply current amount I1 of the current source Ir1 being larger than the supply current amount I2 of the current source Ir2 (I1>I2).

The switch 13 receives the input signal S11 corresponding to the turn-on signal, whereas the switch 14 receives the input signal S12 corresponding to the turn-off signal from the second input terminal P12. The switch 13 is on while the input signal S11 is "H", and the switch 14 is on while the input signal S12 is "H".

The current I1 flows in the resistor RS4 of the level shifting base portion 8 when the input signal S11 rises, and the current I2 flows in the resistor RS4 of the level shifting base portion 8 when the input signal S12 rises. As a result, a potential V11 at the node N1 at the rising of the input signal S11 and a potential V12 at the node N1 at the rising of the input signal S12 are in V11<V12 relation.

The node N1 is connected to negative inputs of comparators C2 and C3. A reference voltage Vref1 is applied to a positive input of the comparator C2, and a reference voltage Vref2 is applied to a positive input of the comparator C3. The reference voltages Vref1 and Vref2 satisfy: V11<Vref1<V12<Vref2<V10 where V10 is a potential at the node N1 when the transistor QN is off.

The output of the comparator C2 is the output signal S01 corresponding to the input signal S11, the output signal S01 being outputted from the output terminal P01. The output of the comparator C2 is also applied to the input of the inverter G5.

The outputs of the comparator C3 and inverter G5 are inputted to the AND gate G6 which in turn outputs the output signal S02 corresponding to the input signal S12, the output signal S02 being outputted from the output terminal P02.

The "H" and "L" levels of the comparator C2, comparator C3, inverter G5 and AND gate G6 are specified by the control voltage VH and capacitor GND voltage VCP (not shown).

In the foregoing arrangement, when the input signal S11 rises, the comparators C2 and C3 go high, the output signal S01 accordingly being "H" specified by the control voltage VH and the output signal S02 being "L" specified by the capacitor GND voltage VCP. On the other hand, when the input signal S12 rises, the comparator C2 goes low and the comparator C3 goes high, the output signal S02 accordingly being "H" specified by the control voltage VH and the output signal S01 being "L" specified by the capacitor GND voltage VCP.

The level shifting circuit is adapted to select the two output signals S01 and S02 by judging which one of the input signals S11 and S12 rises as a function of the difference in the amount of current in the resistor RS4. This provides a level shifting circuit adapted for two input signals using only one high breakdown voltage transistor.

In applications of this method, a level shifting circuit adapted for three or more input signals may be achieved using only one high breakdown voltage transistor.

The drain current value of the transistor QN is controlled in the example of FIG. 9 by current mirror connection between the high breakdown voltage transistor QN and the low breakdown voltage transistor QM. Other constructions may be substituted therefor wherein a plurality of drain current values of the transistor QN may be controlled.

<Level Shifting Circuit (5)>

Figure 10:
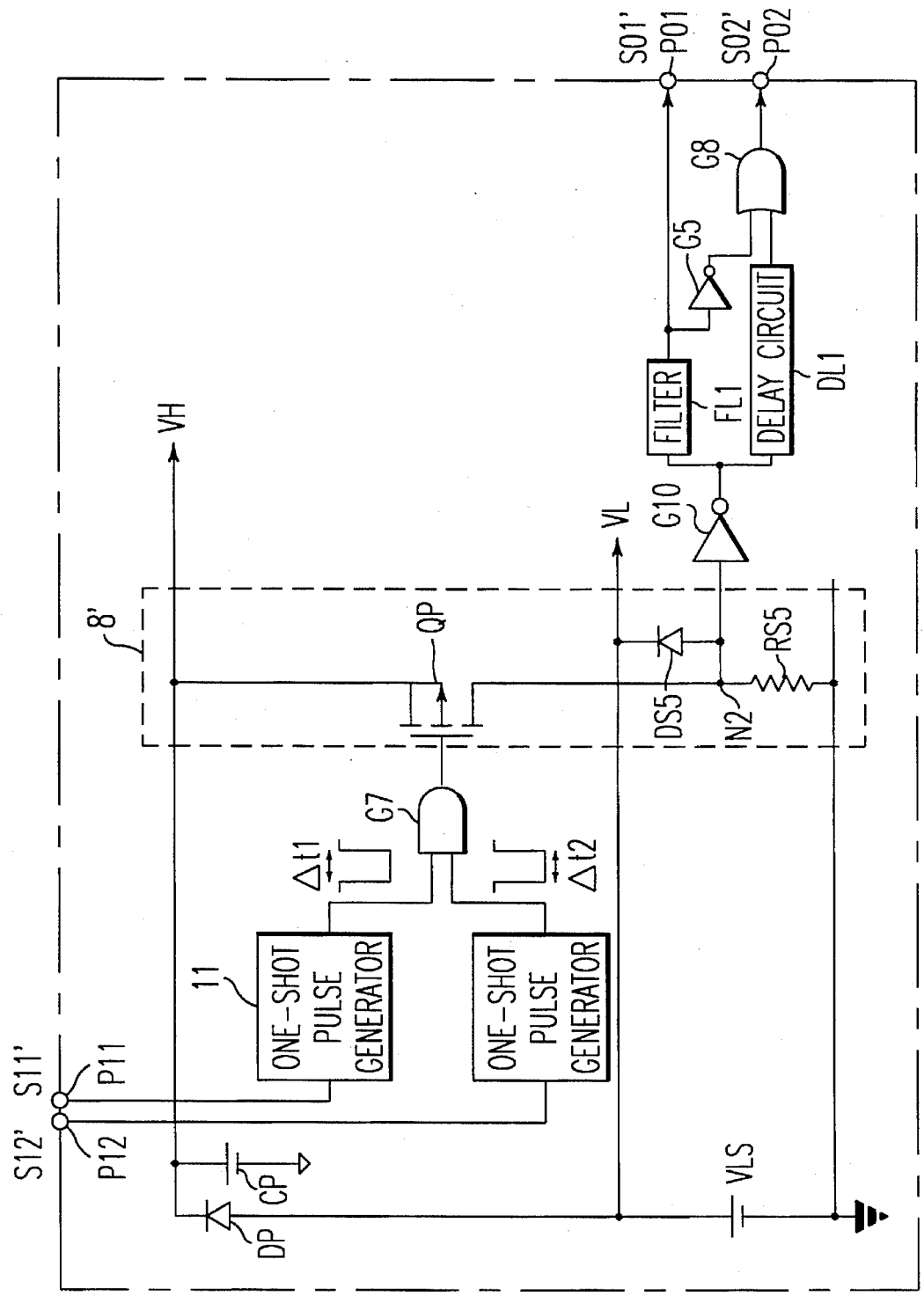

FIG. 10 is a circuit diagram of a first arrangement wherein the level shifting circuits $L_{UV}$ and $L_{OC}$ are formed with one high breakdown voltage transistor. A level shifting base portion 8' including a resistor RS5, a diode DS5 and transistor QP, the capacitor CP, the inverter G10, the control voltage VH, and the control voltage VL of FIG. 10 are identical with those of the level shifting circuit $L_{ON}$ of FIG. 6, and the detailed description thereof will be omitted herein.

Referring to FIG. 10, the one-shot pulse generator 11 receives an input signal S11' corresponding to the control voltage detection signal SM from the first input terminal P11, and the one-shot pulse generator 12 receives an input signal S12' corresponding to the overcurrent detection signal SO from the second input terminal P12. The one-shot pulse generator 11 waveform-reshapes the falling of the input signal S11' into an "L" level signal of pulse width Δt1, which is outputted to an AND gate G7. The one-shot pulse generator 12 waveform-reshapes the falling of the input signal S12' into an "L" level signal of pulse width Δt2 (<Δt1), which is outputted to the AND gate G7.

The output of the AND gate G7 is applied to the gate of the P-channel MOS transistor QP of high breakdown voltage. The "L" level of the AND gate G7 is set to a level which permits a predetermined drain current to flow in the transistor QP.

When the input of the AND gate G7 is "L", the transistor QP is on and the potential at the node N2 is "H". The duration of this state is the time period Δt1 at the falling of the input signal S11' and is the time period Δt2 at the falling of the input signal S12'.

The inverter (G10 inverts the "H" level potential into "L" level which is outputted to the filter FL1 and the delay circuit DL1. The filter FL1 performs a filtering processing on the "H" level signal by means of the time constant Δt3 (Δt2<Δt3<Δt1). The delay circuit DL1 delays an input signal by the delay time Δt3. The output of the filter FL1 is an output signal S01' corresponding to the input signal S11', the output signal S01' being outputted from the external terminal P01. The output of the filter FL1 is also applied to the input of the inverter G5.

The outputs of the delay circuit DL1 and inverter G5 are applied to an OR gate G8, which in turn outputs an output signal S02' corresponding to the input signal S12', the output signal S02' being outputted from the output terminal P02. The "H" and "L" levels of the inverter G5 and OR gate G8 are specified by the control voltage VL and ground level (not shown).

When the input signal S11' falls, since the "L" output period of the inverter G10 is Δt1, the output signal S01' is "L" specified by the ground level and the output signal S02' is "H" specified by the control voltage VL. When the input signal S12' falls, since the output period of the inverter G10 is Δt2, the output signal S02' is "L" specified by the ground level and the output signal S01' is "H" specified by the control voltage VH.

The level shifting circuit, as above described, is adapted to select the two output signals S01' and S02' by judging which one of the two input signals S11' and S12' falls as a function of the difference in "L" pulse width of the inverter G10. This accomplishes the level shifting circuit adapted for two input signals using only one high breakdown voltage transistor.

In applications of this method, a level shifting circuit adapted for three or more input signals may be achieved using one high breakdown voltage transistor.

<Level Shifting Circuit (6)>

Figure 11:
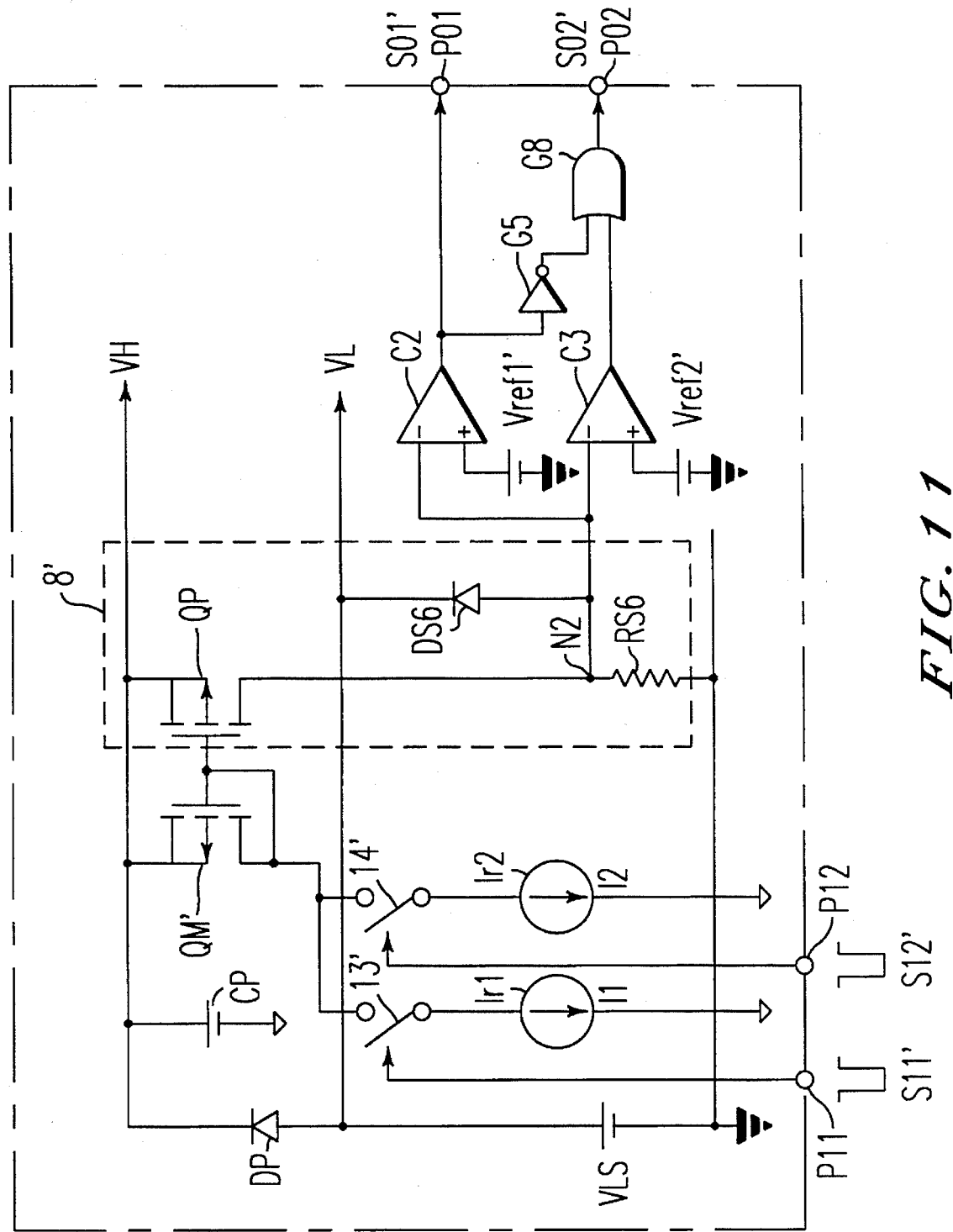

FIG. 11 is a circuit diagram of a second arrangement wherein the level shifting circuits $L_{UV}$ and $L_{OC}$ are formed with one high breakdown voltage transistor. The level shifting base portion 8' including a resistor RS6, a diode DS6 and transistor QP, the capacitor CP, the control voltage VH, and the control voltage VL of FIG. 11 are identical with those of the level shifting circuit $L_{UV}$ of FIG. 7, and the detailed description thereof will be omitted herein.

Referring to FIG. 11, the P-channel MOS transistor QP of high breakdown voltage of the level shifting base portion 8' and a P-channel transistor QM' of low breakdown voltage are current mirror connected to each other. The drain of the transistor QM' is connected to the current sources Ir1 and Ir2 through switches 13' and 14'. The current sources Ir1 and Ir2 are connected to the negative electrode of the capacitor CP, the supply current amount I1 of the current source Ir1 being larger than the supply current amount I2 of the current source Ir2 (I1>I2).

The switch 13' receives the input signal S11' corresponding to the control voltage detection signal SM from the first input terminal P11, and the switch 14' receives the input signal S12' corresponding to the overcurrent detection signal SO from the second input terminal P12. The switch 13' is on while the input signal S11' is "L", and the switch 14' is on while the input signal S12' is "L".

Thus the current I1 flows in the resistor RS6 of the level shifting base portion 8' when the input signal S11' falls, and the current I2 flows in the resistor RS6 of the level shifting base portion 8' when the input signal S12' falls. As a result, a potential V21 at the node N2 at the falling of the input signal S11' and a potential V22 at the node N2 at the falling of the input signal S12' are in V21>V22 relation.

The node N2 is connected to the negative inputs of the comparators C2 and C3. A reference voltage Vref1' is applied to the positive input of the comparator C2, and a reference voltage Vref2' is applied to the positive input of the comparator C3. The reference voltages Vref1' and Vref2' satisfy: V21<Vref1'>V22>Vref2'>V20 where V20 is a potential at the node N2 when the transistor QP is off.

The output of the comparator C2 is the output signal S01' corresponding to the input signal S11', the output signal S01' being outputted from the output terminal P01. The output of the comparator C2 is also applied to the input of the inverter G5.

The outputs of the comparator C3 and inverter G5 are applied to the OR gate G8, which in turn outputs the output signal S02' corresponding to the input signal S12', the output signal S02' being outputted from the output terminal P02.

The "H" and "L" levels of the comparators C2, C3, inverter G5, and OR gate G8 are specified by the control voltage VL and the ground level (not shown).

When the input signal S11' falls, the comparators C2 and C3 go low, the output signal S01' accordingly being "L" specified by the ground level and the output signal S02' being "H" specified by the control voltage VL. When the input signal S12' falls, the comparator C2 goes high and the comparator C3 goes low, the output signal S02' accordingly being "L" specified by the ground level and the output signal S01' being "H" specified by the control voltage VL.

The level shifting circuit, as above described, is adapted to select the two output signals S01' and S02' by judging which one of the two input signals S11' and S12' falls as a function of the difference in current amount in the resistor RS6. This accomplishes the level shifting circuit adapted for two input signals using only one high breakdown voltage transistor.

In applications of this method, a level shifting circuit adapted for three or more input signals may be achieved using only one high breakdown voltage transistor.

The drain current value of the transistor QP is controlled in the example of FIG. 11 by current mirror connection between the high breakdown voltage transistor QP and the low breakdown voltage transistor QM'. Other constructions, however, may be substituted therefor wherein a plurality of drain current values of the transistor QP may be controlled.

<Level Shifting Circuit (7)>

Figure 16:
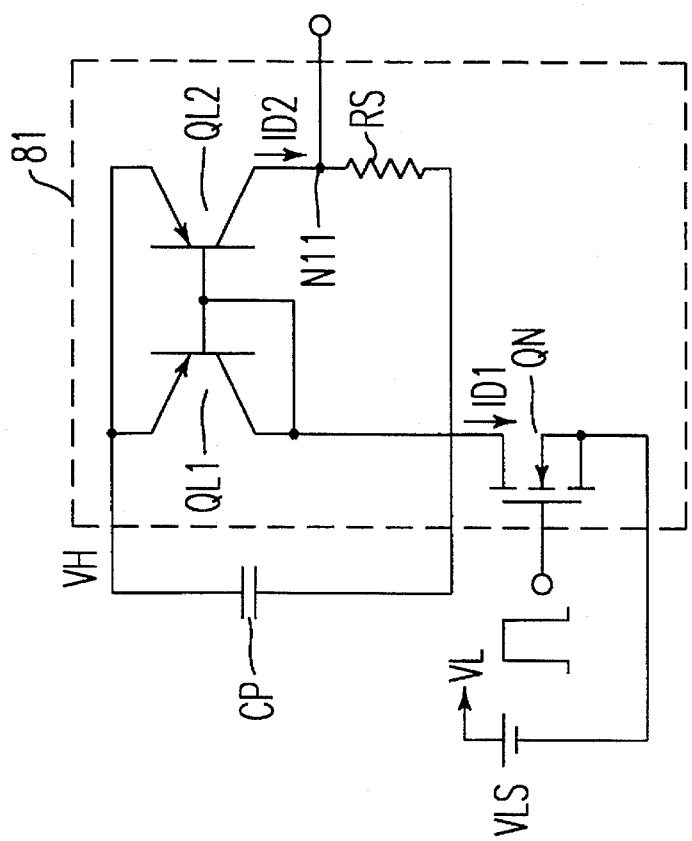
FIG. 16 is a circuit diagram of a seventh level shifting circuit.

FIG. 16 is a circuit diagram of a variation of the level shifting base portion 8 of the level shifting circuit of FIGS. 6, 8 and 9.

A level shifting base portion 81 includes the N-channel transistor QN of high breakdown voltage, the resistor RS, and PNP bipolar transistors QL1 and QL2, as shown in FIG. 16. The transistors QL1 and QL2 are current mirror connected to each other, and the control voltage VH is applied in common to the emitters of the transistors QL1 and QL2.

The collector of the transistor QL1 is connected to the drain of the transistor QN, and the collector of the transistor QL2 is connected to the resistor RS. A potential at a node N11 between the emitter of the transistor QL2 and the resistor RS is a detection potential.

Such arrangement enables a potential proportional to the drain current ID1 of the transistor QN to be detected from the node Nil, providing the operation equivalent to that of the level shifting base portion 8.

Although the PNP bipolar transistors form the current mirror structure in FIG. 16, the present invention is not limited thereto. Any transistor which is a low breakdown voltage device such as a P-channel MOSFET of low breakdown voltage may be used to form the current mirror structure.

<Level Shifting Circuit (Others)>

The level shifting circuits (3) and (4) include the N-channel MOSFET of high breakdown voltage. However, N-channel IGBT and NPN transistor of high breakdown voltage may be substituted for the N-channel MOSFET of high breakdown voltage.

Further, a P-channel MOSFET, a P-channel IGBT, and a PNP transistor may be substituted for the N-channel MOSFET of high breakdown voltage. In this case, the current mirror circuit for use in the level shifting base portion 81 of FIG. 16 is formed by NPN transistor and N-channel MOSFET of low breakdown voltage.

The same is true for the P-channel MOSFET of high breakdown voltage of the level shifting circuits (5) and (6).

<Output Voltage Detecting Circuit (1)>

Figure 12:
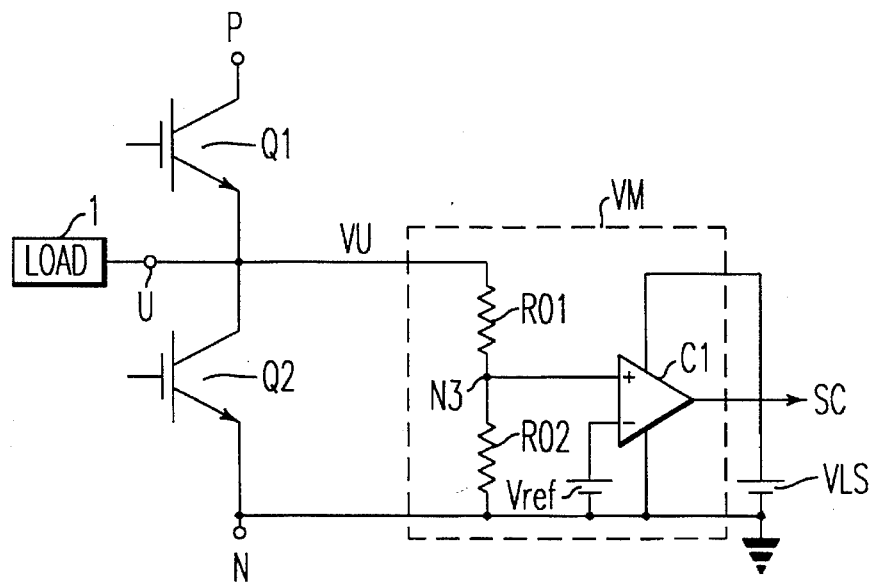
FIGS. 12 and 13 are circuit diagrams of first and second output voltage detecting circuits, respectively.

FIG. 12 is a circuit diagram of a first arrangement of the output voltage detecting circuit VM employed in the second and third preferred embodiments. The output voltage detecting circuit VM includes resistors R01, R02 and a comparator C1, as shown in FIG. 12. The resistors R01 and R02 are connected in series between the connecting point U and the power source N. The comparator C1 is driven by the power supply VLS and has a positive input connected to the node N3 between the resistors R01 and R02 and a negative input receiving the reference voltage Vref. The output of the comparator C1 is the potential comparison signal SC. It should be noted that the reference voltage Vref is higher than the ground level and lower than $\{VL \cdot R02/(R01+R02)\}$.

In this arrangement, when the potential at the connecting point U is "H", the potential at the node N3 is higher than the reference voltage Vref, the potential comparison signal SC being "H". On the other hand, when the potential at the connecting point U is "L", the potential at the node N3 is lower than the reference voltage Vref, the potential comparison signal SC being "L".

<Output Voltage Detecting Circuit (2)>

Figure 13:
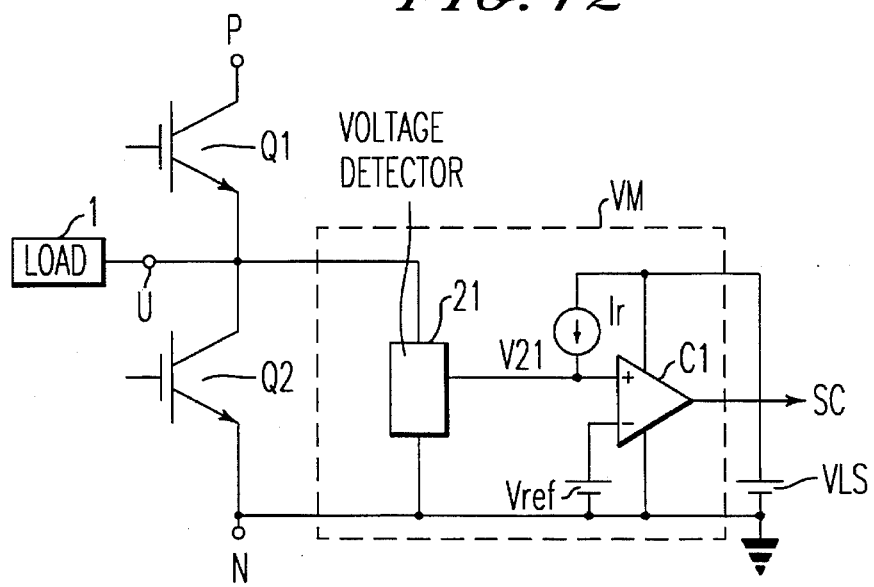

FIG. 13 is a circuit diagram of a second arrangement of the output voltage detecting circuit VM employed in the second and third preferred embodiments. The output voltage detecting circuit VM includes a voltage detector 21, a current source Ir, and the comparator C1, as shown in FIG. 13. The voltage detector 21 is formed between the connecting point U and the power source N. The current source Ir is provided between the positive electrode of the power supply VLS and the voltage detector 21 to supply current to the voltage detector 21. The voltage detector 21 detects the potential VU at the connecting point U without using a high breakdown voltage resistor to output the detected voltage V21. An example of the voltage detector 21 is disclosed in Japanese Patent Application No. 1-340202 which relatively facilitates the integration since no high breakdown voltage resistor is used. The comparator C1 is driven by the power supply VLS and has a positive input receiving the detected voltage V21 of the voltage detector 21 and a negative input receiving the reference voltage Vref. The output of the comparator C1 is the potential comparison signal SC. The reference voltage Vref is higher than the ground level and lower than the control voltage VL.

In this arrangement, when the potential at the connecting point U is "H", the detected voltage V21 is higher than the reference voltage Vref, the potential comparison signal SC being "H". On the other hand, when the potential VU at the connecting point U is "L", the detected voltage VU is lower than the reference voltage Vref, the potential comparison signal SC being "L".

Comparison is made between the first arrangement of the output voltage detecting circuit VM shown in FIG. 12 and the second arrangement thereof shown in FIG. 13. The second arrangement including the voltage detector 21 which is of high breakdown voltage and is easily integrated in place of the high breakdown voltage resistor that is difficult to integrate, is easier to integrate than the first arrangement even if the additional provision of the current source Ir is taken into consideration.

<Output Current Direction Detecting Circuit>

Figure 14:
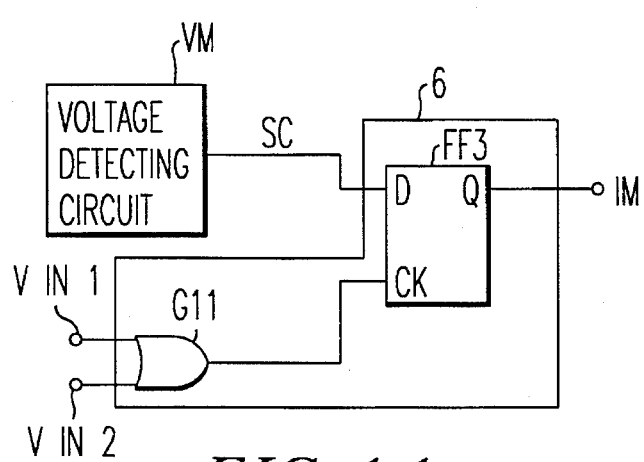
FIG. 14 is a circuit diagram of an output current direction detecting circuit.

FIG. 14 is a circuit diagram showing the internal structure of the output current direction detecting circuit 6 employed in the second and third preferred embodiments. The output current direction detecting circuit 6 includes a D flip-flop FF3 and an OR gate G11, as shown in FIG. 14. The OR gate G11 receives the input signals $V_{IN}1$ and $V_{IN}2$, and the output of the OR gate G11 is applied to a clock input CK.

The flip-flop FF3 has a data input D receiving the potential comparison signal SC of the output voltage detecting circuit VM and outputs the output direction indication signal IM as a Q-output thereof.

In such arrangement, the value of the potential comparison signal SC when both of the input signals $V_{IN}1$ and $V_{IN}2$ are "H" is the output direction indication signal IM. Thus the verification of the "H" or "L" level of the output direction indication signal IM enables the recognition of the output direction of the output current flowing at the connecting point U.

In general, since the transistors Q1 and Q2 are controlled such that one of them is on, current is supplied from one of the power sources P and N to the inductive load 1.

Figure 15:
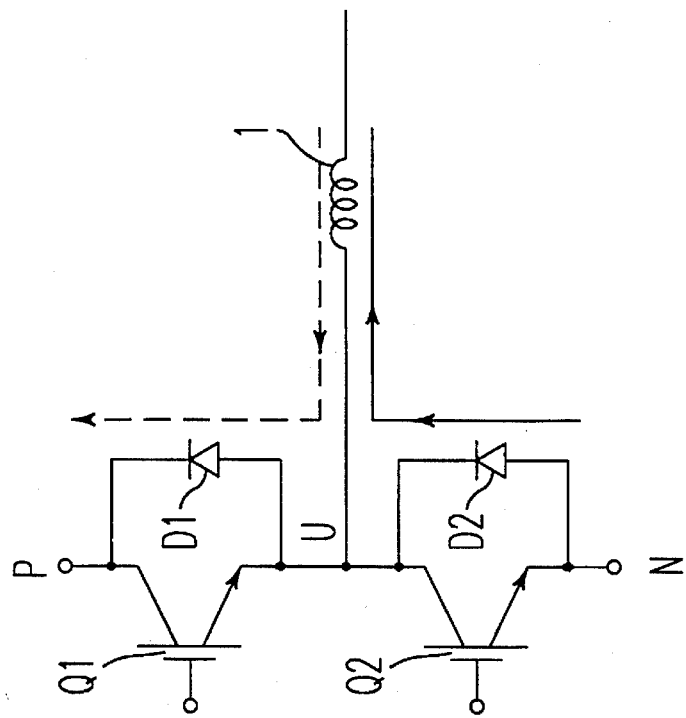
FIG. 15 is a circuit diagram for delineating the operation of the output current direction detecting circuit.
Figure 17:
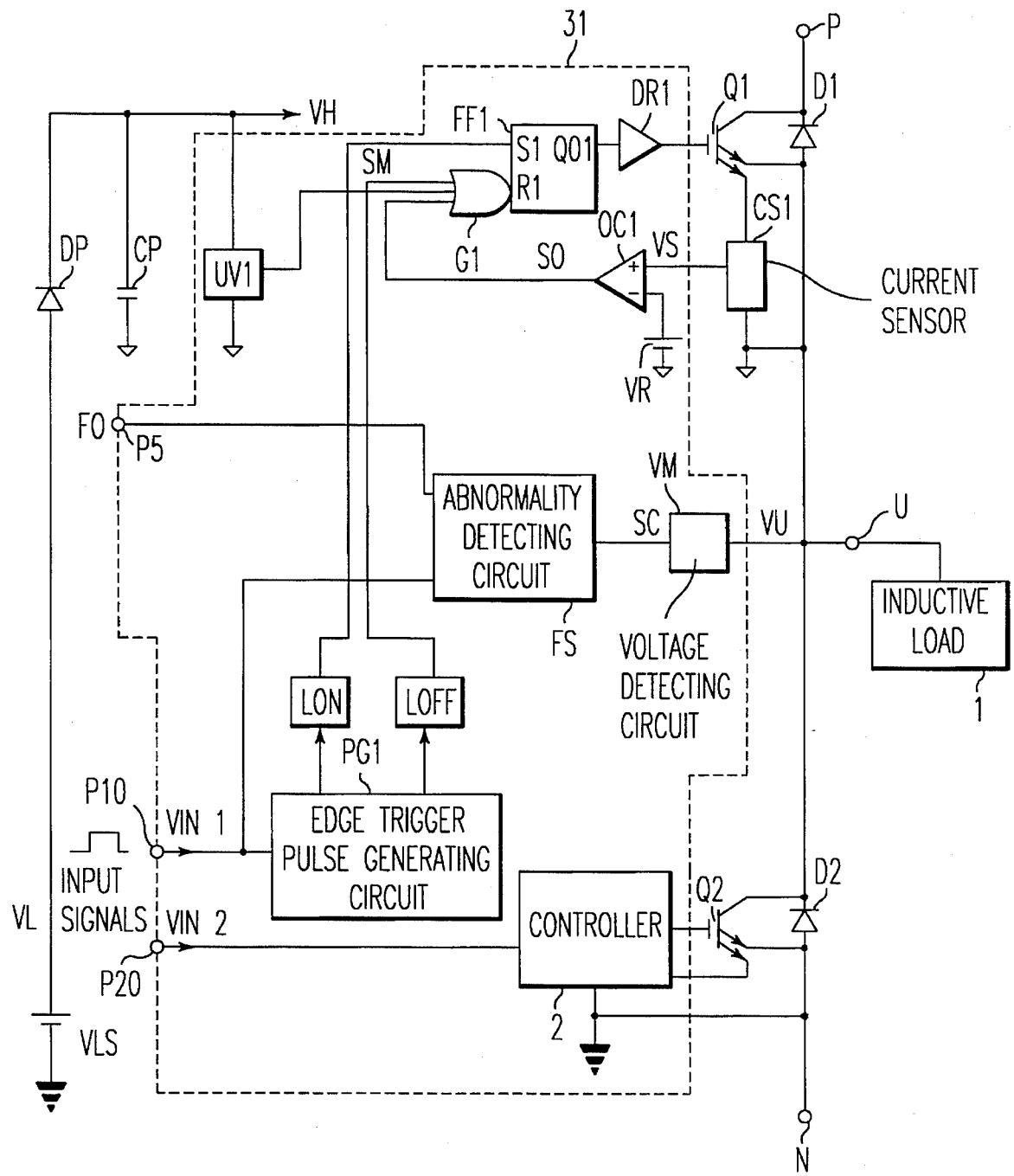
FIG. 17 is a circuit diagram of a conventional control circuit for power devices.

When both of the transistors Q1 and Q2 are off, a counter electromotive force is generated in the inductive load 1 to maintain the flow immediately before the off-state. For example, a current flow from the power source N through the diode D2 to the inductive load 1, as shown in solid line of FIG. 15, causes the potential VU a the connecting point to go low. Conversely, a current flow from the inductive load 1 through the diode D1 to the power source P, as shown in dotted line of FIG. 15, causes the potential VU at the connecting point U to go high. Taking advantage of such properties, the direction of the output current flowing at the connecting point U is recognized as a function of the "H" and "L" levels of the output direction indication signal IM of the output current direction detecting circuit 6.

For control of power devices, it is general to positively provide a dead time during which both of the transistors Q1 and Q2 are off in switching of the on-state device between the transistors Q1 and Q2. This is to avoid the simultaneous on-state of the transistors Q1 and Q2 in consideration for their property that the turn-off time is longer than the turn-on time.

The recognition of the current direction at the connecting point U, if taking advantage of the dead time, may prevent the current direction detecting period from overlapping the abnormality detecting period caused when one of the transistors Q1 and Q2 are on. There is no problem if both of the abnormality detecting circuit FS' and the output current direction detecting circuit 6 employ one output voltage detecting circuit VM in common in the second or third preferred embodiment.

<Modifications>

Each of the control circuits 51 to 53 for power devices according to the first to third preferred embodiments may be formed as one high breakdown voltage semiconductor integrated circuit, in which respective elements thereof are monolithically integrated on a single semiconductor chip.

Integration may be achieved so as to include power device portions (the portions indicated by the dashed-and-dotted lines of FIGS. 1, 3, and 5) of the power devices such as the transistors Q1, Q2 which are small in size.

The power supply VLS for generating the control voltage VL charges the capacitor CP in the first to third preferred embodiments. The present invention, however, may be applied to the case wherein the capacitor CP is charged from the main power source P through a normal diode and a resistive Zener diode during the time the connecting point U is at low potential.

Figure 18:
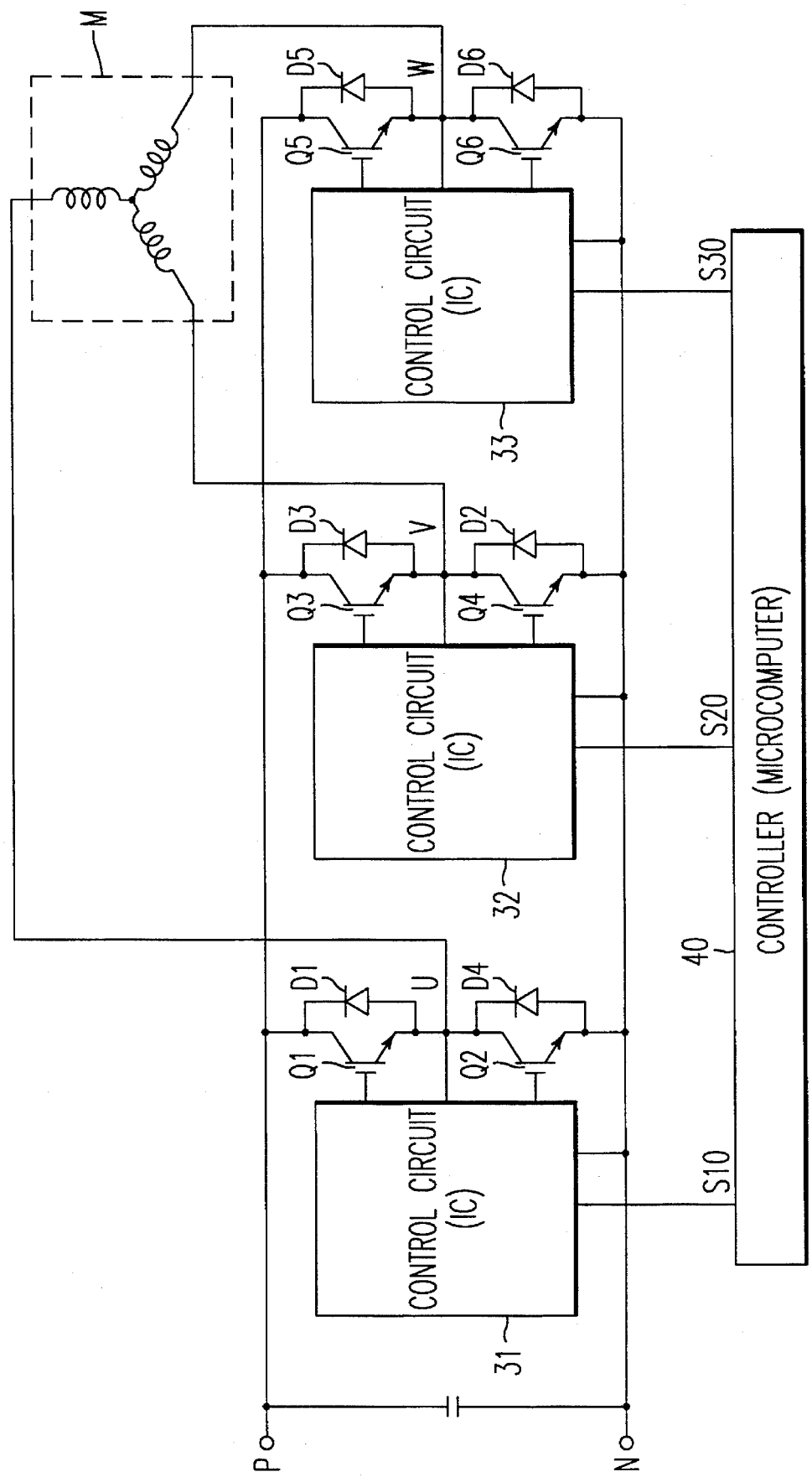
FIG. 18 is a circuit diagram showing the practical use of the control circuit for power devices.

Although the first to third preferred embodiments employ the control circuit for power devices such as the transistors Q1 and Q2 of half bridge structure, the present invention is not limited thereto. The present invention may be applied to each of two or more half-bridge structures connected in parallel and connected in common to an inductive load such as motor, as shown in FIG. 18.

The present invention is also applicable to a high side switch structure which does not require the power device corresponding to the transistor Q2.

While the invention has been shown and described in detail, the foregoing description is in all aspects illustrative and not restrictive. It is therefore understood that numerous modifications and variations can be devised without departing from the scope of the invention.

What is claimed is:

1. A control circuit coupled to a power transistor for applying a control signal to a control electrode of said power transistor in response to an input signal, said control circuit being driven by a control power voltage applied from a capacitor coupled to a control power source, said power transistor being operable to be turned-on and -off in response to first and second levels of said control signal, respectively, said control circuit comprising:

(a) voltage monitor means for monitoring said control power voltage to generate a voltage drop signal when said control power voltage drops below a reference voltage level due to discharge of said capacitor;

(b) recovery signal generating means for generating a recovery signal when a predetermined time period passed after said voltage drop signal has been generated, said predetermined time period being longer than a time required for re-charging said capacitor by said control power source;

(c) signal control means for generating said control signal in response to said input signal and said voltage drop signal, comprising:
      (c-1) first circuit means for providing said second level to said control electrode in response to a first level-transition of said input signal and said voltage drop signal; and
      (c-2) second circuit means for providing said first level to said control electrode in response to a second level-transition of said input signal and said recovery signal.

2. The control circuit of claim 1, further comprising:

(d) current monitor means for monitoring main current flowing through said power transistor to generate an overcurrent signal when said main current is larger than a reference current value, said signal control means being operable to provide said second level to said control electrode also in response to said overcurrent signal; and (e) first and second output means for outputting said voltage drop signal and said overcurrent signal, respectively.

3. The control circuit of claim 2, wherein:

said control power voltage is at a first control power voltage level;

respective voltages of said input signal and said voltage drop signal are at a second control power voltage level; and said signal control means further comprises:
      (c-3) level shifter means for shifting said respective voltages of said input signal and said voltage drop signal to said first power voltage level.

4. The control circuit of claim 3, wherein said recovery signal generating means comprises: (b-1) means for transmitting to said first output means said voltage drop signal whose voltage level is shifted by said level shifter means.

5. The control circuit of claim 4, wherein respective elements of said control circuit are monolithically integrated on a single semiconductor chip.

6. A control circuit coupled to a power transistor for applying a control signal to a control electrode of said power transistor in response to an input signal, said control circuit being driven by a control power voltage applied from a capacitor coupled to a control power source, said power transistor being operable to be turned on and off in response to first and second levels of said control signal, respectively, said control circuit comprising:

(a) voltage monitor means for monitoring said control power voltage to generate a voltage drop signal when said control power voltage drops below a reference voltage level;

(b) current monitor means for monitoring main current flowing through said power transistor to generate an overcurrent signal when said main current is larger than a reference current value, said current monitor means comprising: (b-1) holding means for holding said overcurrent signal until a cancel signal for cancelling said overcurrent signal is given to said holding means;

(c) voltage detector means for detecting a voltage level at one of main electrodes of said power transistor to generate a voltage signal indicating said voltage level, said voltage detector means comprising: (c-1) recovery signal generating means for generating a recovery signal when a predetermined first time period has passed after the level of said voltage signal has changed, said first time period being longer than a time required for re-charging said capacitor by said control power source;

(d) signal control means for generating said control signal in response to said input signal, said voltage drop signal and said overcurrent signal, comprising:

(d-1) first circuit means for providing said first level to said control electrode in response to a first-type level-transition of said input signal and said recovery signal, (d-2) second circuit means for providing said second level to said control electrode in response to a second-type level-transition of said input signal, said voltage drop signal and said overcurrent signal, and (d-3) means for detecting said voltage signal when a predetermined second time period has passed after the level of said voltage signal has changed, to selectively generate a first output signal and a second output signal according to the level of said voltage signal detected, said second time period being longer than said first time period; and (e) first and second output means for outputting said first and said second output signals, respectively.

7. The control circuit of claim 6, further comprising:

(f) current direction detector means coupled to said one of said main electrodes of said power transistor for detecting a direction of said main current flowing across main electrodes of said power transistor.

8. The control circuit of claim 7, wherein:

said control power voltage is at a first control power voltage level;

said input signal and said recovery signal are at a second control power voltage level; and said signal control means further comprises:

(d-3) level shifter means for shifting said second control power voltage level of said input signal and said recovery signal to said first control power voltage level.

9. The control circuit of claim 7, wherein:

said holding means comprises:

(b-1-1) means for generating said cancel signal in response to said second-type level-transition of said input signal.

10. The control circuit of claim 7, wherein:

said holding means comprises:

(b-1-2) means for delaying said overcurrent signal to generate a delayed overcurrent signal; and (b-1-3) means for inputting said delayed overcurrent signal to said holding means as said cancel signal.

11. The control circuit of claim 6, wherein respective elements of said control circuit are monolithically integrated on a single semiconductor chip.

12. A level shifter for converting first and second input signals of a first voltage level to first and second output signals of a second voltage level, comprising:

(a) a first signal converter for converting said first input signal to a first pulse having a first pulse width;

(b) a second signal converter for converting said second input signal to a second pulse having a second pulse width;

(c) a signal synthesizer for synthesizing said first and second pulses to generate a synthesized signal;

(d) a transistor having a control electrode to which said synthesized signal is supplied; and (e) an output signal generator coupled to a main electrode of said transistor for detecting a time period during which said transistor is in a conductive state to generate said first output signal when said time period corresponds to said first pulse width and to generate said second output signal when said time period corresponds to said second pulse width.

13. The level shifter of claim 12, wherein said output signal generator comprises:

(e-1) a resistance connected to said second voltage level and said main electrode through which a current flows when said transistor is in said conductive state;

(e-2) a voltage converter coupled to said resistance for converting a voltage drop across said resistance into a voltage signal being in an active level when said voltage drop has a level higher than a reference level: and (e-3) detector means for detecting a time period during which said voltage signal is in said active level to selectively generate said first and second output signals.

14. The level shifter of claim 13, wherein said detector means comprises:

(e-3-1) a delay circuit for delaying said voltage signal to obtain a delayed voltage signal;

(e-3-2) an inverter for inverting said voltage signal to obtain an inverted voltage signal;

(e-3-3) AND gate means for obtaining an AND signal of said voltage signal and said inverted voltage signal; and (e-3-4) output means for outputting said voltage signal and said AND signal as said first and second output signals, respectively.

15. The level shifter of claim 12, wherein said output signal generator comprises:

(e-4) a current mirror circuit coupled to said main electrode of said transistor and operable at said second voltage level to obtain a current signal equivalent to a main current of said transistor;

(e-5) a resistor coupled to said mirror circuit;

(e-6) a voltage convertor coupled to said resistor, for converting a voltage drop across said resistor into a voltage signal being in an active level when said voltage drop has a level higher than a reference level; and (e-7) detector means for detecting a time period during which said voltage signal is in said active level to selectively generate said first and second output signals.

16. The level shifter of claim 12, wherein respective elements of said level shifter are monolithically integrated on a single semiconductor chip.

17. A level shifter for converting first and second input signals of a first voltage level to first and second output signals of a second voltage level, comprising:

(a) a first signal converter for generating a first current in response to said first input signal;

(b) a second signal converter for generating a second current in response to said second input signal;

(c) a current mirror circuit for receiving said first and second currents and outputting a current signal equivalent to the sum of said first and second currents;

(d) current/voltage converter means for converting said current signal into a voltage signal; and (e) output signal generator means for comparing said voltage signal with first and second reference voltages to generate said first and second output signals, respectively.

18. The level shifter of claim 17, wherein said current/voltage converter means comprises:

(d-1) a resistor connected to said second voltage level and an output electrode of said current mirror circuit, said voltage signal being obtained from a node between said resistor and said output electrode of said current mirror circuit.

19. The level shifter of claim 18, wherein said output signal generator means comprises:

(e-1) first and second comparators for comparing said voltage signal with said first and second reference voltages to obtain first and second resultant signals, respectively;

(e-2) inverter means for inverting said first resultant signal to obtain an inverted signal;

(e-3) AND gate means for obtaining an AND signal of said second resultant signal and said inverted signal; and (e-4) output means for outputting said voltage signal and said AND signal as said first and second output signals, respectively.

20. The level shifter of claim 19, wherein said first current generator comprises:

(a-1) a first current source; and (a-2) a switching circuit inserted between said first current source and said current mirror circuit, operable to open and close a current path from said first current source to said current mirror circuit in response to said first input signal; and said second current generator comprises:

(a-1) a second current source; and (a-2) a switching circuit inserted between said second current source and said current mirror circuit, operable to open and close a current path from said second current source to said current mirror circuit in response to said second input signal.

21. The level shifter of claim 17, wherein respective elements of said level shifter are monolithically integrated on a single semiconductor chip.

\* \* \* \* \*